(12) United States Patent
Shimizu

(10) Patent No.: US 10,998,400 B2
(45) Date of Patent: May 4, 2021

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/555,291

(22) Filed: Aug. 29, 2019

(65) Prior Publication Data

US 2020/0303494 A1 Sep. 24, 2020

(30) Foreign Application Priority Data

Mar. 18, 2019 (JP) .............................. JP2019-050329

(51) Int. Cl.
*H01L 29/06* (2006.01)
*H01L 29/16* (2006.01)
(Continued)

(52) U.S. Cl.
CPC ........ *H01L 29/063* (2013.01); *H01L 29/0696* (2013.01); *H01L 29/0856* (2013.01);
(Continued)

(58) Field of Classification Search
CPC ...................... H01L 29/7802; H01L 29/66712
See application file for complete search history.

(56) References Cited

U.S. PATENT DOCUMENTS 9,825,121 B2 11/2017 Iijima et al.
10,056,479 B2 8/2018 Yoo et al.
(Continued)

FOREIGN PATENT DOCUMENTS

JP 2016-127073 A 7/2016
WO WO 2016/116988 A1 7/2016
WO WO 2016/129068 A1 8/2016

OTHER PUBLICATIONS

Naoki Tega, et al., "Robustness improvement of short-circuit capability by SiC trench-etched double-diffused MOS (TED MOS)" Proceedings of the 30th International Symposium on Power Semiconductor Devices & ICs, 2018, pp. 439-442.
(Continued)

*Primary Examiner* — Farun Lu
(74) *Attorney, Agent, or Firm* — Oblon, McClelland, Maier & Neustadt, L.L.P.

(57) ABSTRACT

A semiconductor device includes a semiconductor layer having first and second planes; a first semiconductor region of a first conductivity type; second and third semiconductor regions of a second conductivity type between the first semiconductor region and the first plane; a fourth semiconductor region of a first conductivity type between the second semiconductor region and the first plane; a fifth semiconductor region of a first conductivity type between the third semiconductor region and the first plane; first and second trenches between the fourth and fifth semiconductor regions and over from the second to third semiconductor region; a sixth semiconductor region between the second and third semiconductor regions and between the first and second trenches; a seventh semiconductor region of a second conductivity type between the first trench and the first semiconductor region and contacting the second and third semi-
(Continued)

conductor regions; a first and second gate electrode in the trenches.

16 Claims, 15 Drawing Sheets

(51) Int. Cl.
    *H01L 29/78*     (2006.01)
    *H01L 29/423*     (2006.01)
    *H01L 29/10*     (2006.01)
    *H01L 29/08*     (2006.01)
    *H01L 29/66*     (2006.01)

(52) U.S. Cl.
    CPC ...... *H01L 29/0873* (2013.01); *H01L 29/0878* (2013.01); *H01L 29/1045* (2013.01); *H01L 29/1608* (2013.01); *H01L 29/4236* (2013.01); *H01L 29/4238* (2013.01); *H01L 29/66712* (2013.01); *H01L 29/7802* (2013.01); *H01L 29/7803* (2013.01); *H01L 29/7813* (2013.01)

(56) References Cited

U.S. PATENT DOCUMENTS

| | | |
|---|---|---|
| 2018/0331174 A1 | 11/2018 | Tega et al. |
| 2019/0181261 A1* | 6/2019 | Okumura ................ H01L 29/45 |

OTHER PUBLICATIONS

T. Suto, et al., "1.2kV SiC trench-etched double-diffused MOS (TED-MOS) for electric vehicle", Proceedings of ECSCREM2018_TU.02a.03, 2 pages.

Naoki Tega, et al., "Channel Properties of SiC Trench-Etched Double-Implanted MOS (TED MOS)", IEEE Transactions on Electron Devices, vol. 63, No. 9, 2016, pp. 3439-3444.

* cited by examiner

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-050329, filed on Mar. 18, 2019, the entire contents of which are incorporated herein by reference.

FIELD

Embodiments described herein relate generally to semiconductor devices, inverter circuits, driving devices, vehicles, and elevators.

BACKGROUND

Silicon carbide (SiC) is expected as a material for the next generation of semiconductor devices. The silicon carbide has excellent physical properties such as a band gap of about 3 times, a breakdown field strength of about 10 times, and a thermal conductivity of about 3 times compared to silicon (Si). By utilizing these properties, a semiconductor device capable of being low loss and performing high temperature operation can be realized.

However, for example, in the case of forming a metal oxide semiconductor field effect transistor (MOSFET) by using the silicon carbide, there is a problem in that it is difficult to reduce on-resistance. There is a method of reducing the on-resistance by employing a trench gate structure and increasing a channel density. However, in the case of the trench gate structure, there is a problem in that the electric field strength applied to the gate insulating layer becomes high, and the reliability of the gate insulating layer is lowered.

DETAILED DESCRIPTION

Figure 1:
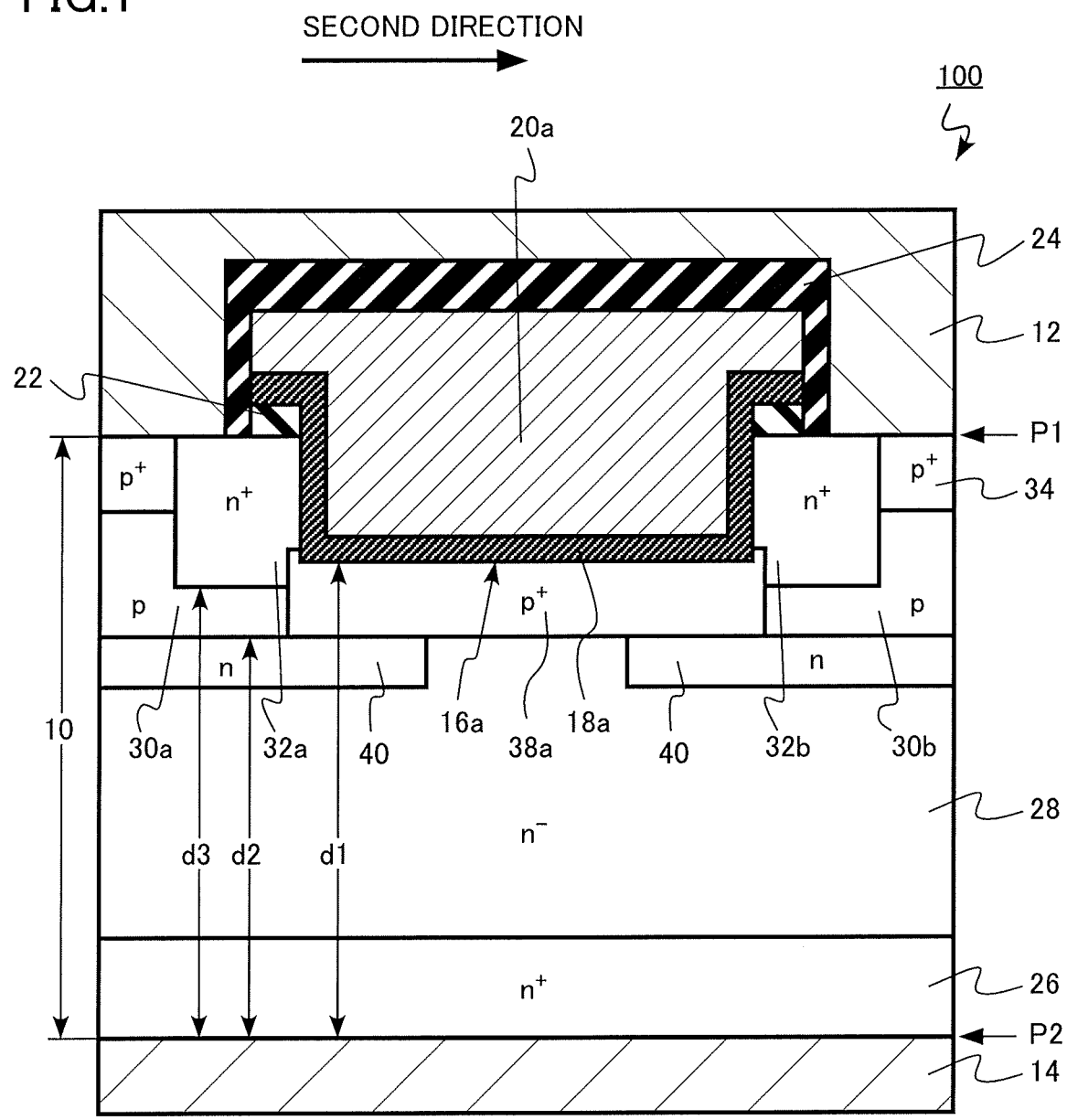
FIG. 1 is a schematic cross-sectional view of a semiconductor device according to a first embodiment.

A semiconductor device according to an embodiment includes: a semiconductor layer having a first plane and a second plane facing the first plane; a first semiconductor region of a first conductivity type existing in the semiconductor layer; a second semiconductor region of a second conductivity type existing in the semiconductor layer and being located between the first semiconductor region and the first plane; a third semiconductor region of a second conductivity type existing in the semiconductor layer and being located between the first semiconductor region and the first plane; a fourth semiconductor region of a first conductivity type existing in the semiconductor layer and being located between the second semiconductor region and the first plane; a fifth semiconductor region of a first conductivity type existing in the semiconductor layer and being located between the third semiconductor region and the first plane; a first trench existing in the semiconductor layer and being located between the fourth semiconductor region and the fifth semiconductor region and over from the second semiconductor region to the third semiconductor region; a second trench existing in the semiconductor layer and being located between the fourth semiconductor region and the fifth semiconductor region and over from the second semiconductor region to the third semiconductor region; a sixth semiconductor region of a first conductivity type existing in the semiconductor layer, being located between the first semiconductor region and the first plane, and being located between the second semiconductor region and the third semiconductor region and between the first trench and the second trench; a seventh semiconductor region of a second conductivity type existing in the semiconductor layer, being located between the first trench and the first semiconductor region, and being in contact with the second semiconductor region and the third semiconductor region; an eighth semiconductor region of a second conductivity type existing in the semiconductor layer, being located between the second trench and the first semiconductor region, and being in contact with the second semiconductor region and the third semiconductor region; a first gate electrode located in the first trench; a second gate electrode located in the second trench; a first gate insulating layer located between the first gate electrode and the second semiconductor region and between the first gate electrode and the third semiconductor region; a second gate insulating layer located between the second gate electrode and the second semiconductor region and between the second gate electrode and the third semiconductor region; a first electrode located on a side of the semiconductor layer closer to the first plane; and a second electrode located on a side of the semiconductor layer closer to the second plane.

Hereinafter, embodiments will be described with reference to the drawings. In the following description, in some cases, the same or similar members are denoted by the same reference numerals, and the description of the members or the like that have been described once is omitted as appropriate.

In addition, in the following description, the expressions $n^+$, n, $n^-$ and $p^+$, p, $p^-$ indicate the relative heights of the impurity concentrations in the respective conductivity types. That is, it is indicated that n+ is relatively higher in the n-type impurity concentration than n, and n− is relatively lower in the n-type impurity concentration than n. In addition, it is indicated that p+ is relatively higher in the p-type impurity concentration than p, and p− is relatively lower in the p-type impurity concentration than p. In addition, in some cases, the n+-type and the n−-type may be simply described as the n-type, and the p+-type and the p−-type may be simply described as the p-type. The impurity concentration in each region is represented, for example, by the value of the impurity concentration in the central portion of each region, unless otherwise specified.

First Embodiment

A semiconductor device according to a first embodiment includes: a semiconductor layer having a first plane and a second plane facing the first plane; a first semiconductor region of a first conductivity type existing in the semiconductor layer; a second semiconductor region of a second conductivity type existing in the semiconductor layer and being located between the first semiconductor region and the first plane; a third semiconductor region of a second conductivity type existing in the semiconductor layer and being located between the first semiconductor region and the first plane; a fourth semiconductor region of a first conductivity type existing in the semiconductor layer and being located between the second semiconductor region and the first plane; a fifth semiconductor region of a first conductivity type existing in the semiconductor layer and being located between the third semiconductor region and the first plane; a first trench existing in the semiconductor layer and being located between the fourth semiconductor region and the fifth semiconductor region and over from the second semiconductor region to the third semiconductor region; a second trench existing in the semiconductor layer and being located between the fourth semiconductor region and the fifth semiconductor region and over from the second semiconductor region to the third semiconductor region; a sixth semiconductor region of a first conductivity type existing in the semiconductor layer, being located between the first semiconductor region and the first plane, and being located between the second semiconductor region and the third semiconductor region and between the first trench and the second trench; a seventh semiconductor region of a second conductivity type existing in the semiconductor layer, being located between the first trench and the first semiconductor region, and being in contact with the second semiconductor region and the third semiconductor region; an eighth semiconductor region of a second conductivity type existing in the semiconductor layer, being located between the second trench and the first semiconductor region, and being in contact with the second semiconductor region and the third semiconductor region; a first gate electrode located in the first trench; a second gate electrode located in the second trench; a first gate insulating layer located between the first gate electrode and the second semiconductor region and between the first gate electrode and the third semiconductor region; a second gate insulating layer located between the second gate electrode and the second semiconductor region and between the second gate electrode and the third semiconductor region; a first electrode located on a side of the semiconductor layer closer to the first plane; and a second electrode located on a side of the semiconductor layer closer to the second plane.

Hereinafter, a case where the semiconductor layer is a silicon carbide will be described as an example. In addition, a case where the first conductivity type is n-type and the second conductivity type is p-type will be described as an example.

FIG. 1 is a schematic cross-sectional view of the semiconductor device according to the first embodiment. The semiconductor device according to the first embodiment is a trench gate type vertical transistor 100 having a gate electrode in a trench. The vertical transistor 100 is a MOSFET with a fin structure in which the gate electrode is provided on a side surface of a narrow portion of the semiconductor layer. The vertical transistor 100 is a transistor having electrons as carriers.

Figure 2:
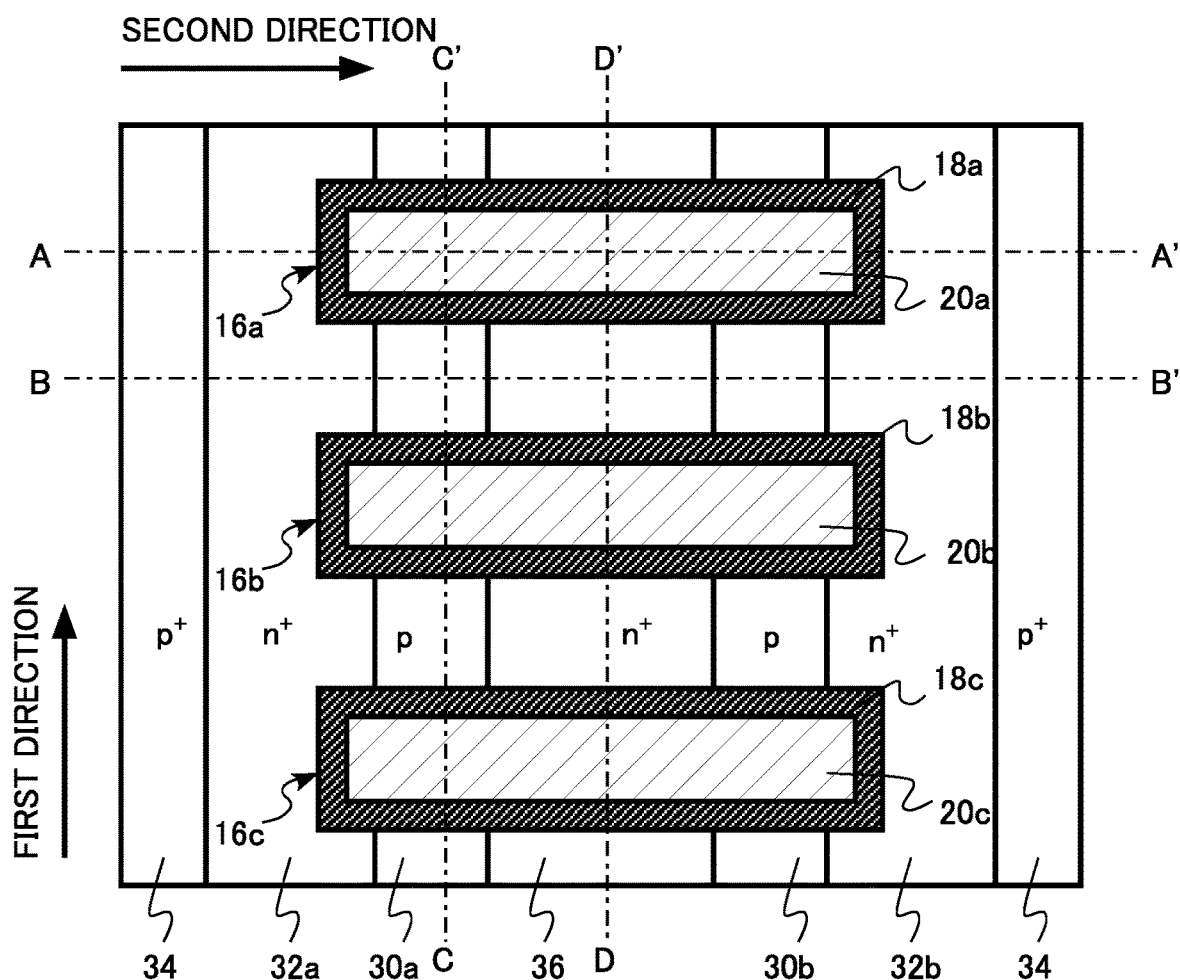
FIG. 2 is a schematic top view of the semiconductor device according to the first embodiment.

FIG. 2 is a schematic top view of the semiconductor device according to the first embodiment. FIG. 2 is a view illustrating a first plane of a silicon carbide layer 10. FIG. 1 is a cross-sectional view taken along line AA' of FIG. 2.

Figure 3:
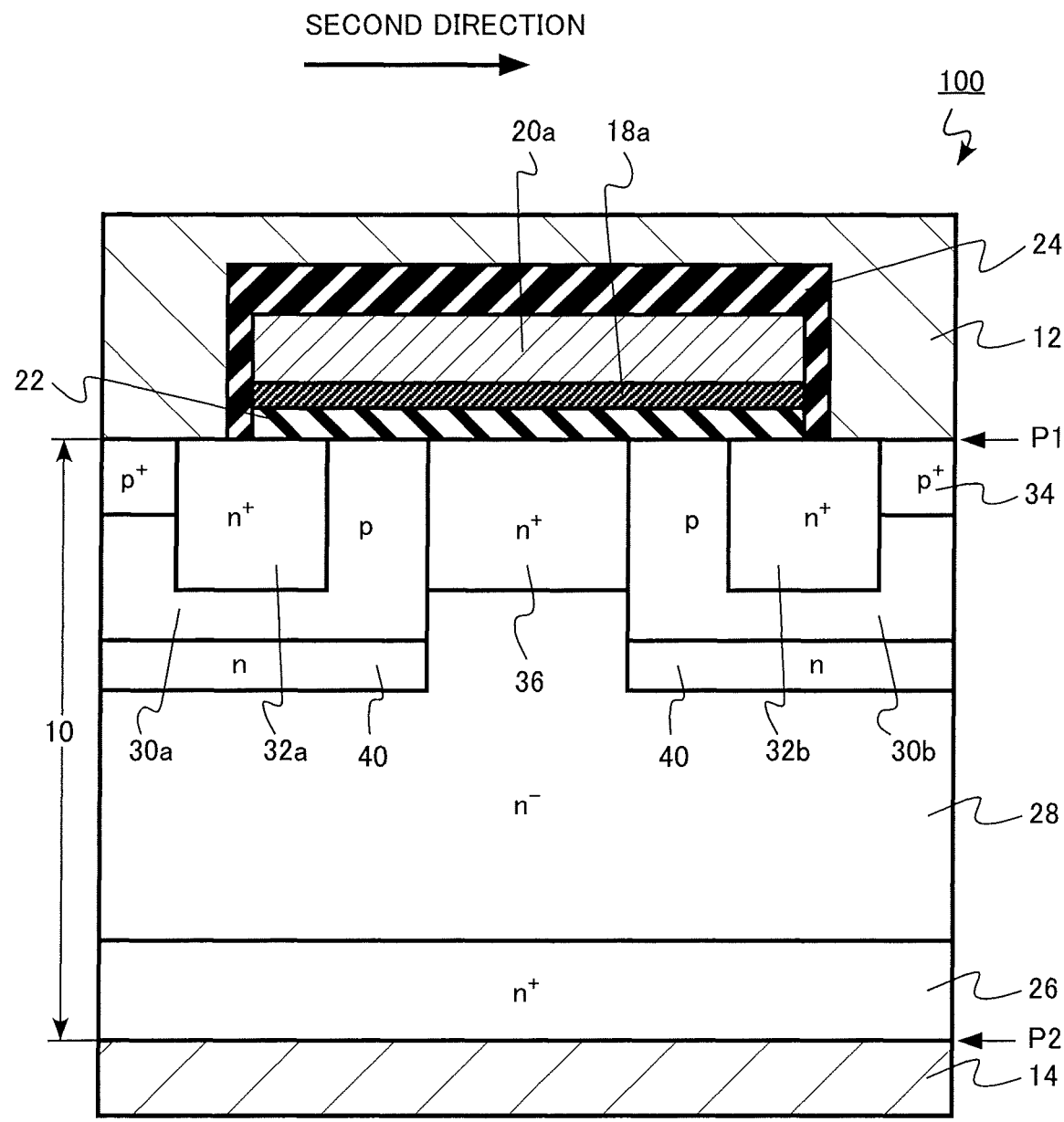
FIG. 3 is a schematic cross-sectional view of the semiconductor device according to the first embodiment.

FIG. 3 is a schematic cross-sectional view of the semiconductor device according to the first embodiment. FIG. 3 is a cross-sectional view taken along line BB' of FIG. 2.

Figure 4:
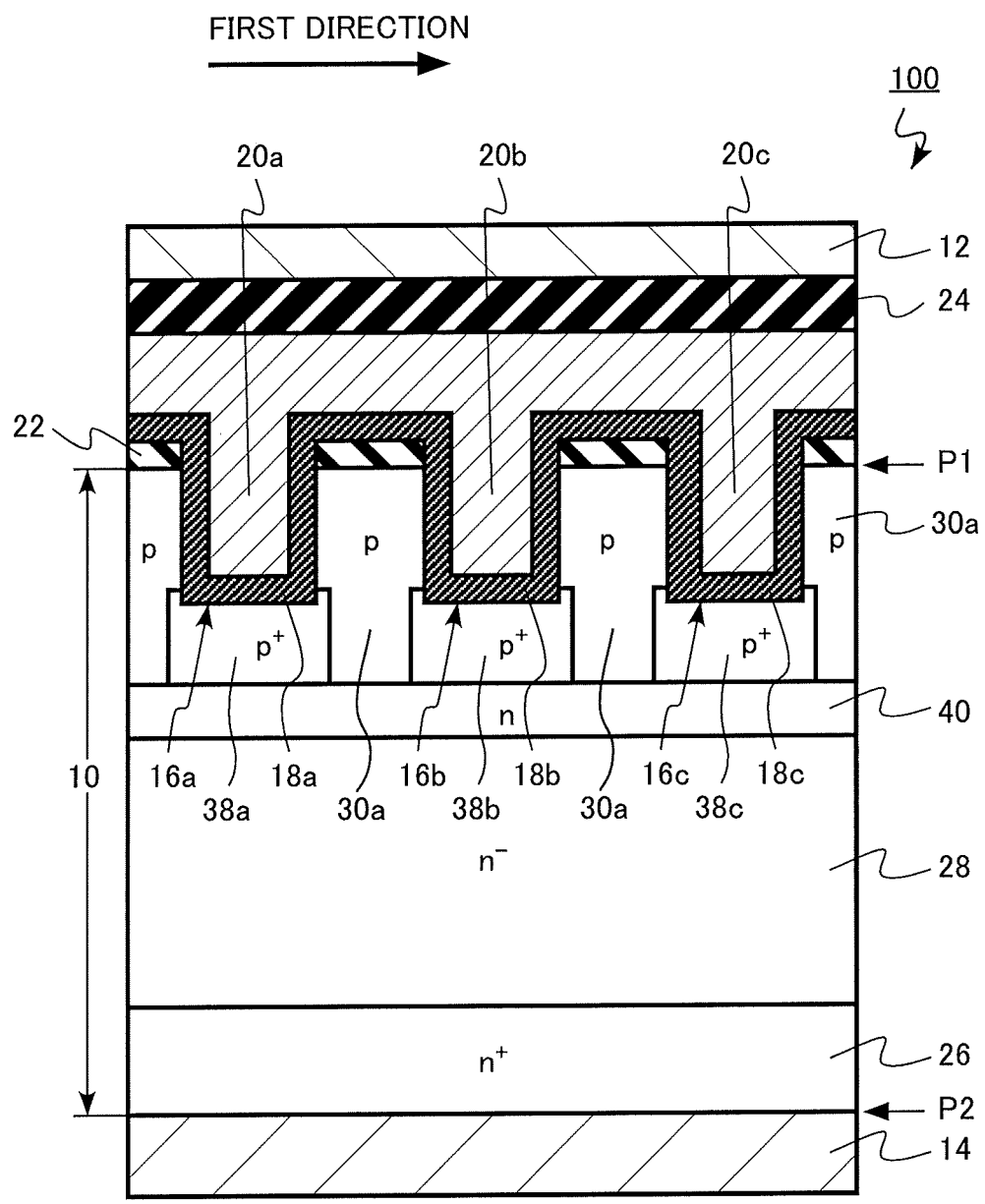
FIG. 4 is a schematic cross-sectional view of the semiconductor device according to the first embodiment.

FIG. 4 is a schematic cross-sectional view of the semiconductor device according to the first embodiment. FIG. 4 is a cross-sectional view taken along line CC' of FIG. 2.

Figure 5:
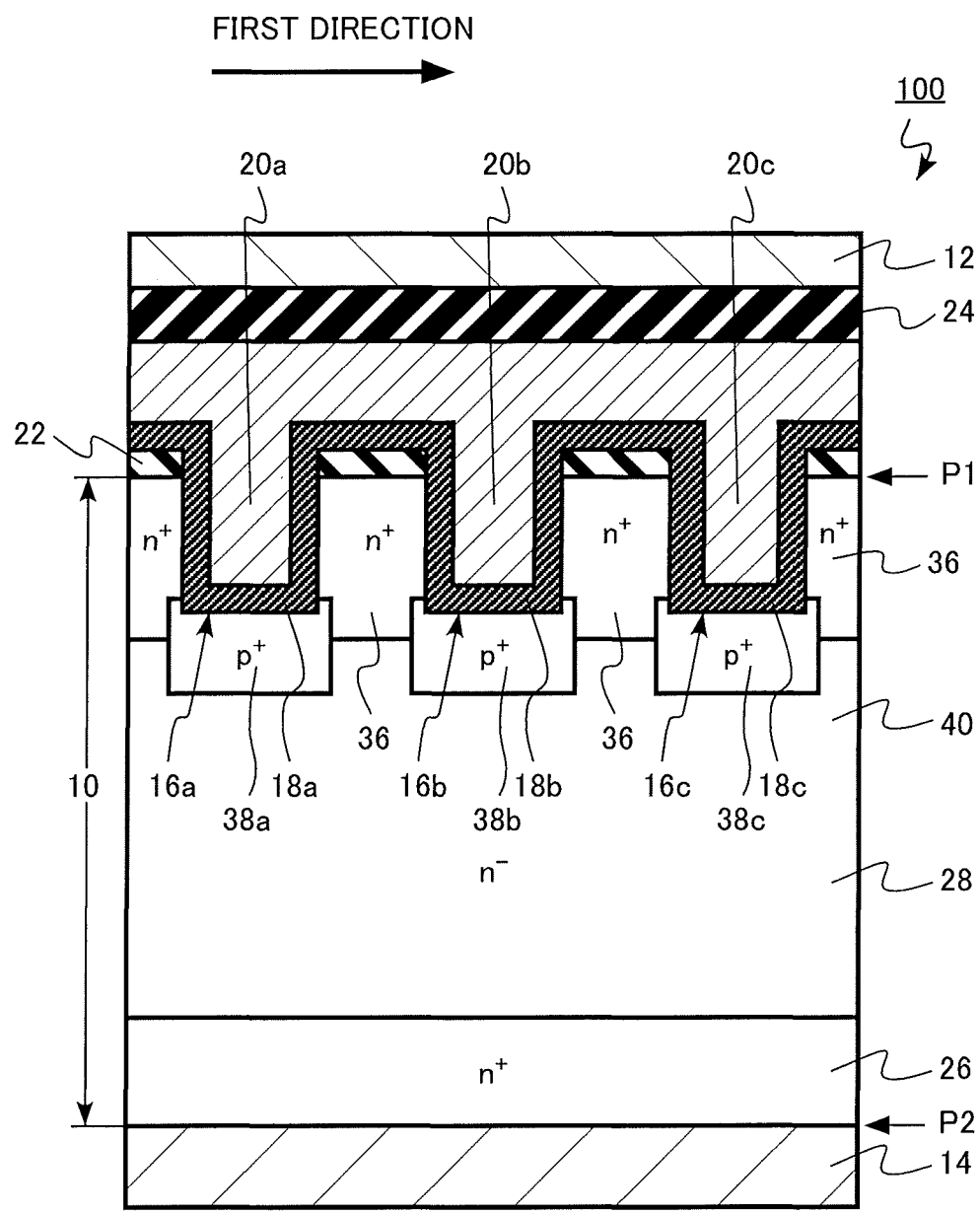
FIG. 5 is a schematic cross-sectional view of the semiconductor device according to the first embodiment.

FIG. 5 is a schematic cross-sectional view of the semiconductor device according to the first embodiment. FIG. 5 is a cross-sectional view taken along line DD' of FIG. 2.

The vertical transistor 100 includes a silicon carbide layer 10 (semiconductor layer), a source electrode 12 (first electrode), a drain electrode 14 (second electrode), a first trench 16a, a second trench 16b, a third trench 16c, a first gate insulating layer 18a, a second gate insulating layer 18b, a third gate insulating layer 18c, a first gate electrode 20a, a second gate electrode 20b, a third gate electrode 20c, a pad insulating layer 22, and an interlayer insulating layer 24.

A drain region 26, a drift region 28 (first semiconductor region), a first p-well region 30a (second semiconductor region), a second p-well region 30b (third Semiconductor region), a first source region 32a (fourth semiconductor region), a second source region 32b (fifth semiconductor region), a p-well contact region 34, a JFET region 36 (sixth semiconductor region), a first electric field relaxation region 38a (seventh semiconductor region), a second electric field relaxation region 38b (eighth semiconductor region), a third electric field relaxation region 38c, and a first current diffusion region 40 (ninth semiconductor region) exist in the silicon carbide layer 10.

Figure 6:
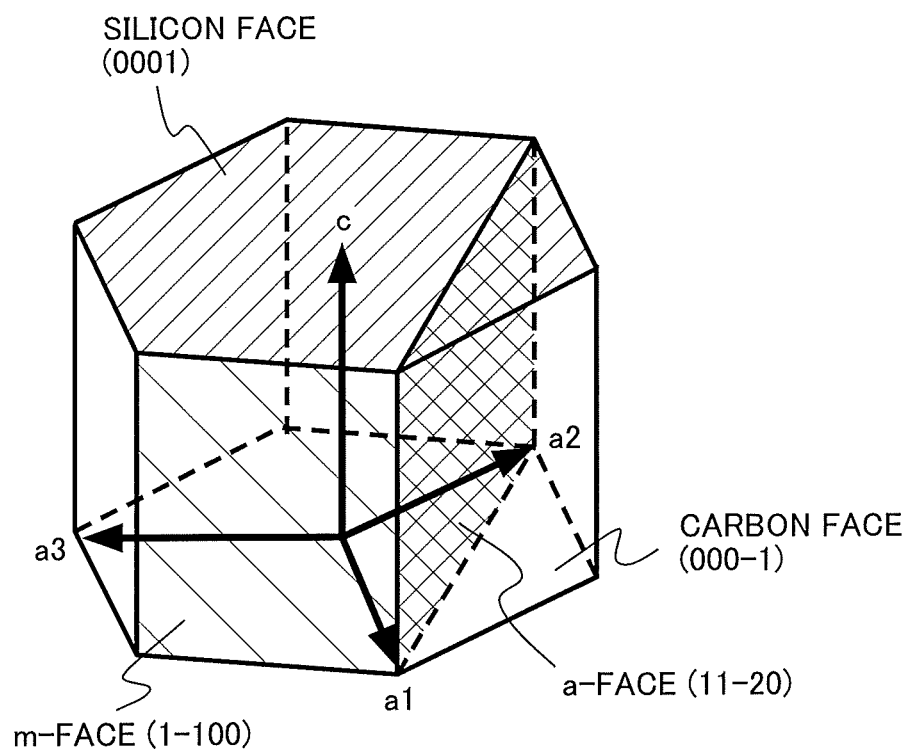
FIG. 6 is a view illustrating a crystal structure of a SiC semiconductor.

FIG. 6 is a view illustrating a crystal structure of a SiC semiconductor. A representative crystal structure of the SiC semiconductor is a hexagonal crystal system such as 4H—SiC.

In the SiC semiconductor having a hexagonal crystal system, one of faces (top faces of a hexagonal column) having the c-axis along the axial direction of the hexagonal column as a normal is a (0001) face. The (0001) face is referred to as a silicon face. Silicon atoms (Si) are arranged on the outermost face of the silicon face.

The other of the faces (top faces of the hexagonal column) having the c axis along the axial direction of the hexagonal column as a normal is the (000-1) face. The (000-1) face is called a carbon face. Carbon atoms (C) are arranged on the outermost face of the carbon face.

A side face (column face) of the hexagonal column is an m-face, that is, a {1-100} face, which is a face equivalent to the (1-100) face. In addition, a face passing through a pair of ridges not adjacent to each other is an a-face, that is, a {11-20} face, which is a face equivalent to the (11-20) face.

On the outermost face of them-face and the a-face, both silicon atoms (Si) and carbon atoms (C) are arranged. The m-face and the a-face are nonpolar faces.

The silicon carbide layer 10 is, for example, a single crystal of 4H—SiC. The silicon carbide layer 10 has a first plane P1 and a second plane P2. The second plane P2 faces the first plane P1. The first plane P1 is the front surface of the silicon carbide layer 10, and the second plane P2 is the back surface of the silicon carbide layer 10.

In the present specification, "depth" denotes a distance in a direction from the first plane P1 to the second plane P2 with respect to the first plane P1.

Hereinafter, a case where the first plane P1 of the silicon carbide layer 10 is a plane inclined at 0 degrees to 10 degrees with respect to the silicon face and the second plane P2 is a plane inclined at 0 degrees to 10 degrees with respect to the carbon face will be described as an example. The first plane P1 of the silicon carbide layer 10 has an off angle of 0 degrees or more and 10 degrees or less with respect to the silicon face.

The characteristics of the plane inclined at 0 degrees or more and 10 degrees or less with respect to the silicon face can be regarded as substantially equal to the silicon face. In addition, a plane inclined at 0 degrees to 10 degrees with respect to the carbon face can be considered to be substantially the same as the carbon face.

The drain region 26 is an n$^+$-type SiC. The drain region 26 contains, for example, nitrogen (N) as n-type impurities. The n-type impurity concentration of the drain region 26 is, for example, $1\times10^{18}$ cm$^{-3}$ or more and $1\times10^{21}$ cm$^{-3}$ or less.

The drift region 28 is an n$^-$-type SiC. The drift region 28 is located between the drain region 26 and the first plane P1.

The drift region 28 contains, for example, nitrogen (N) as n-type impurities. The n-type impurity concentration of the drift region 28 is, for example, $1\times10^{15}$ cm$^{-3}$ or more and $2\times10^{16}$ cm$^{-3}$ or less. The n-type impurity concentration of the drift region 28 is lower than the n-type impurity concentration of the drain region 26.

The drift region 28 is, for example, an epitaxial growth layer of SiC formed epitaxially on the drain region 26. The thickness of the drift region 28 is, for example, 5 µm or more and 100 µm or less.

The first p-well region 30a is a p-type SiC. The first p-well region 30a is located between the drift region 28 and the first plane P1. A portion of the first p-well region 30a is in contact with the first plane P1. The first p-well region 30a extends in the first direction.

The first p-well region 30a contains, for example, aluminum (Al) as p-type impurities. The p-type impurity concentration of the first p-well region 30a is, for example, $1\times10^{16}$ cm$^{-3}$ or more and $1\times10^{20}$ cm$^{-3}$ or less. The p-type impurity concentration of the first p-well region 30a is, for example, $5\times10^{16}$ cm$^{-3}$ or more.

The depth of the first p-well region 30a is, for example, 0.5 µm or more and 5 µm or less. If epitaxial growth or high energy implantation is used to form the first p-well region 30a, it is possible to form a depth of, for example, 5 µm. In a case where a general ion implantation process is used to form the first p-well region 30a, it is possible to form a depth of, for example, 1.5 µm. The first p-well region 30a functions as a channel region of the vertical transistor 100. Electrons which are carriers flow in the first p-well region 30a in a second direction perpendicular to the first direction.

The second p-well region 30b is a p-type SiC. The second p-well region 30b is located between the drift region 28 and the first plane P1. A portion of the second p-well region 30b is in contact with the first plane P1. The second p-well region 30b extends in the first direction.

The second p-well region 30b contains, for example, aluminum (Al) as p-type impurities. The p-type impurity concentration of the second p-well region 30b is, for example, $1\times10^{16}$ cm$^{-3}$ or more and $1\times10^{20}$ cm$^{-3}$ or less. The p-type impurity concentration of the second p-well region 30b is, for example, $5\times10^{16}$ cm$^{-3}$ or more.

The depth of the second p-well region 30b is, for example, 0.5 µm or more and 5 µm or less. If epitaxial growth or high energy implantation is used to form the second p-well region 30b, it is possible to form a depth of, for example, 5 µm. In a case where a general ion implantation process is used to form the second p-well region 30b, it is possible to form a depth of, for example, 1.5 µm. The second p-well region 30b functions as a channel region of the vertical transistor 100. Electrons which are carriers flow in the second direction perpendicular to the first direction in the second p-well region 30b.

The second p-well region 30b is provided to be spaced apart from the first p-well region 30a in the second direction.

The first source region 32a is an n$^+$-type SiC. The first source region 32a is located between the first p-well region 30a and the first plane P1. A portion of the first source region 32a is in contact with the first plane P1. The first source region 32a extends in the first direction.

The first source region 32a contains, for example, phosphorus (P) as n-type impurities. The n-type impurity concentration of the first source region 32a is, for example, $1\times10^{18}$ cm$^{-3}$ or more and $1\times10^{22}$ cm$^{-3}$ or less. The n-type impurity concentration of the first source region 32a is higher than the n-type impurity concentration of the drift region 28.

The depth of the first source region 32a is smaller than the depth of the first p-well region 30a. The depth of the first source region 32a is, for example, 0.4 µm or more and 4.9 µm or less. If epitaxial growth or high energy implantation is used to form the first source region 32a, the first source region 32a can be formed down to a depth of, for example, 4.9 µm. If a general ion implantation process is used to form the first source region 32a, the first source region 32a can be formed down to a depth of, for example, 1.4 µm.

The second source region 32b is an n$^+$-type SiC. The second source region 32b is located between the second p-well region 30b and the first plane P1. A portion of the second source region 32b is in contact with the first plane P1. The second source region 32b extends in the first direction.

The second source region 32b contains, for example, phosphorus (P) as n-type impurities. The n-type impurity concentration of the second source region 32b is, for example, $1\times10^{18}$ cm$^{-3}$ or more and $1\times10^{22}$ cm$^{-3}$ or less. The n-type impurity concentration of the second source region 32b is higher than the n-type impurity concentration of the drift region 28.

The depth of the second source region 32b is smaller than the depth of the second p-well region 30b. The depth of the second source region 32b is, for example, 0.4 µm or more and 4.9 µm or less. If epitaxial growth or high energy implantation is used to form the second source region 32b, the second source region 32b can be formed down to a depth of, for example, 4.9 µm. If a general ion implantation process is used to form the second source region 32b, the second source region 32b can be formed down to a depth of, for example, 1.4 µm.

The p-well contact region 34 is a p$^+$-type SiC. The p-well contact region 34 is located between the first p-well region 30a and the first plane P1. The p-well contact region 34 is located between the second p-well region 30b and the first plane P1. A portion of the p-well contact region 34 is in contact with the first plane P1. The p-well contact region 34 is adjacent to the first source region 32a. The p-well contact region 34 is adjacent to the second source region 32b. The p-well contact region 34 extends in the first direction.

The p-well contact region 34 contains, for example, aluminum as p-type impurities. The p-type impurity concentration of the p-well contact region 34 is, for example, $1 \times 10^{18}$ cm$^{-3}$ or more and $1 \times 10^{22}$ cm$^{-3}$ or less. The p-type impurity concentration of the p-well contact region 34 is higher than the p-type impurity concentration of the first p-well region 30a and the second p-well region 30b.

The depth of the p-well contact region 34 is smaller than the depths of the first p-well region 30a and the second p-well region 30b. The depth of the p-well contact region 34 is, for example, 0.2 μm or more and 0.4 μm or less.

The first trench 16a exists in the silicon carbide layer 10. The first trench 16a is formed on the side of the silicon carbide layer 10 closer to the first plane P1. The first trench 16a extends in the second direction.

The first trench 16a is located between the first source region 32a and the second source region 32b. The first trench 16a is located over from the first p-well region 30a to the second p-well region 30b. One end of the first trench 16a is located in the first source region 32a, and the other end of the first trench 16a is located in the second source region 32b.

The second trench 16b exists in silicon carbide layer 10. The second trench 16b is formed on the side of the silicon carbide layer 10 closer to the first plane P1. The second trench 16b extends in the second direction.

The second trench 16b is located between the first source region 32a and the second source region 32b. The second trench 16b is located over from the first p-well region 30a to the second p-well region 30b. One end of the second trench 16b is located in the first source region 32a, and the other end of the second trench 16b is located in the second source region 32b.

The third trench 16c exists in the silicon carbide layer 10. The third trench 16c is formed on the side of the silicon carbide layer 10 closer to the first plane P1. The third trench 16c extends in the second direction.

The third trench 16c is located between the first source region 32a and the second source region 32b. The third trench 16c is located over from the first p-well region 30a to the second p-well region 30b. One end of the third trench 16c is located in the first source region 32a, and the other end of the third trench 16c is located in the second source region 32b.

The depths of the first trench 16a, the second trench 16b, and the third trench 16c are, for example, smaller than the depths of the first p-well region 30a and the second p-well region 30b. In other words, the distances (d1 in FIG. 1) between the first trench 16a and the second plane P2, between the second trench 16b and the second plane P2, between the third trench 16c and the second plane P2 are larger than, for example, the distances (d2 in FIG. 1) between the first p-well region 30a and the second plane P2 and between the second p-well region 30b and the second plane P2.

The depths of the first trench 16a, the second trench 16b, and the third trench 16c are smaller than the depths of the first source region 32a and the second source region 32b, for example. In other words, the distances (d1 in FIG. 1) between the first trench 16a and the second plane P2, between the second trench 16b and the second plane P2, and between the third trench 16c and the second plane P2 are larger than, for example, the distances (d3 in FIG. 1) between the first source region 32a and the second plane P2 and between the second source region 32b and the second plane P2.

The first trenches 16a, the second trenches 16b, and the third trenches 16c are arranged at a constant pitch in the first direction. The pitch of the arrangement of the first trenches 16a, the second trenches 16b, and the third trenches 16c is, for example, 0.1 μm or more and 3 μm or less. Typically, the pitch of the arrangement of the trenches is 1 μm. For example, the trench width is 0.5 μm, and the trench spacing is 0.5 μm.

The JFET region 36 is an n$^+$-type SiC. The JFET region 36 is located between the drift region 28 and the first plane P1. The JFET region 36 is located between the first p-well region 30a and the second p-well region 30b. The JFET region 36 is located between the first trench 16a and the second trench 16b.

The JFET region 36 contains, for example, phosphorus (P) as n-type impurities. The n-type impurity concentration of the JFET region 36 is, for example, $2 \times 10^{15}$ cm$^{-3}$ or more and $1 \times 10^{18}$ cm$^{-3}$ or less. The n-type impurity concentration of JFET region 36 is, for example, higher than the n-type impurity concentration of drift region 28. The n-type impurity concentration of the JFET region 36 is, for example, twice or more and 100 times or less the n-type impurity concentration of the drift region 28.

The depth of the JFET region 36 is smaller than the depths of the first p-well region 30a and the second p-well region 30b. The depth of the JFET region 36 is, for example, 0.4 μm or more and 4.9 μm or less. If epitaxial growth or high energy ion implantation is used to form the JFET region 36, the JFET region 36 can be formed down to a depth of, example, 4.9 μm. If general ion implantation process is used to form the JFET region 36, the JFET region 36 can be formed down to a depth of, for example, 1.4 μm.

The first electric field relaxation region 38a is a p$^+$-type SiC. The first electric field relaxation region 38a is located between the first trench 16a and the drift region 28. The first electric field relaxation region 38a is located between the first p-well region 30a and the second p-well region 30b. The first electric field relaxation region 38a is in contact with the first p-well region 30a and the second p-well region 30b. The first electric field relaxation region 38a extends in the second direction.

The first electric field relaxation region 38a contains, for example, aluminum as p-type impurities. The p-type impurity concentration of the first electric field relaxation region 38a is, for example, $1 \times 10^{18}$ cm$^{-3}$ or more and $1 \times 10^{22}$ cm$^{-3}$ or less. The p-type impurity concentration of the first electric field relaxation region 38a is higher than the p-type impurity concentrations of the first p-well region 30a and the second p-well region 30b. The first electric field relaxation region 38a contains, for example, aluminum and boron as p-type impurities.

The second electric field relaxation region 38b is a p$^+$-type SiC. The second electric field relaxation region 38b is located between the second trench 16b and the drift region 28. The second electric field relaxation region 38b is located between the first p-well region 30a and the second p-well region 30b. The second electric field relaxation region 38b is in contact with the first p-well region 30a and the second p-well region 30b. The second electric field relaxation region 38b extends in the second direction.

The second electric field relaxation region 38b contains, for example, aluminum as p-type impurities. The p-type impurity concentration of the second electric field relaxation region 38b is, for example, $1 \times 10^{18}$ cm$^{-3}$ or more and $1 \times 10^{22}$ cm$^{-3}$ or less. The p-type impurity concentration of the second electric field relaxation region 38b is higher than the p-type impurity concentrations of the first p-well region 30a and the second p-well region 30b. The second electric field relaxation region 38b contains, for example, aluminum and boron as p-type impurities.

The third electric field relaxation region 38c is a p$^+$-type SiC. The third electric field relaxation region 38c is located between the third trench 16c and the drift region 28. The third electric field relaxation region 38c is located between the first p-well region 30a and the second p-well region 30b. The third electric field relaxation region 38c is in contact with the first p-well region 30a and the second p-well region 30b. The third electric field relaxation region 38c extends in the second direction.

The third electric field relaxation region 38c contains, for example, aluminum as p-type impurities. The p-type impurity concentration of the third electric field relaxation region 38c is, for example, $1 \times 10^{18}$ cm$^{-3}$ or more and $1 \times 10^{22}$ cm$^{-3}$ or less. The p-type impurity concentration of the third electric field relaxation region 38c is higher than, for example, the p-type impurity concentrations of the first p-well region 30a and the second p-well region 30b. The third electric field relaxation region 38c contains, for example, aluminum and boron as p-type impurities.

The first electric field relaxation region 38a, the second electric field relaxation region 38b, and the third electric field relaxation region 38c are formed, for example, by forming the first trench 16a, the second trench 16b, and the third trenches 16c in the silicon carbide layer 10, and after that, performing ion implantation of p-type impurities into the silicon carbide layer 10 from the bottoms of the first trench 16a, the second trench 16b, and the third trench 16c.

The first current diffusion region 40 is an n-type SiC. The first current diffusion region 40 is located between the drift region 28 and the first p-well region 30a. The first current diffusion region 40 is located between the drift region 28 and the second p-well region 30b.

The first current diffusion region 40 contains, for example, nitrogen (N) or phosphorus (P) as n-type impurities. The n-type impurity concentration of the first current diffusion region 40 is, for example, $2 \times 10^{15}$ cm$^{-3}$ or more and $5 \times 10^{16}$ cm$^{-3}$ or less. The n-type impurity concentration of the first current diffusion region 40 is higher than the n-type impurity concentration of the drift region 28.

The first gate electrode 20a exists in the first trench 16a. The first gate electrode 20a extends in the second direction.

The second gate electrode 20b exists in the second trench 16b. The second gate electrode 20b extends in the second direction.

The third gate electrode 20c exists in the third trench 16c. The third gate electrode 20c extends in the second direction.

The first gate electrode 20a, the second gate electrode 20b, and the third gate electrode 20c are conductors. The first gate electrode 20a, the second gate electrode 20b, and the third gate electrode 20c are, for example, polycrystalline silicon containing n-type impurities or p-type impurities. The first gate electrode 20a, the second gate electrode 20b, and the third gate electrode 20c are made of a metal of, for example, a titanium nitride, a tungsten nitride, tungsten, aluminum, copper, ruthenium, cobalt, nickel, a cobalt silicide, a nickel silicide, or the like. The first gate electrode 20a, the second gate electrode 20b, and the third gate electrode 20c may have a stacked structure of the aforementioned metal or may have a stacked structure of at least one of the aforementioned metals and a polycrystalline silicon containing n-type impurities or p-type impurities.

The first gate insulating layer 18a is located between the first gate electrode 20a and the first p-well region 30a and between the first gate electrode 20a and the second p-well region 30b.

The second gate insulating layer 18b is located between the second gate electrode 20b and the first p-well region 30a and between the second gate electrode 20b and the second p-well region 30b.

The third gate insulating layer 18c is located between the third gate electrode 20c and the first p-well region 30a and between the third gate electrode 20c and the second p-well region 30b.

The first gate insulating layer 18a, the second gate insulating layer 18b, and the third gate insulating layer 18c are, for example, oxides or oxynitrides. The first gate insulating layer 18a, the second gate insulating layer 18b, and the third gate insulating layer 18c are, for example, silicon oxides. The silicon oxide equivalent thicknesses of the first gate insulating layer 18a, the second gate insulating layer 18b, and the third gate insulating layer 18c are, for example, 10 nm or more and 50 nm or less.

The first gate insulating layer 18a, the second gate insulating layer 18b, and the third gate insulating layer 18c may be made of, for example, a hafnium oxide, a hafnium oxynitride, a hafnium oxide silicate, a hafnium oxynitride silicate, a zirconium oxide, a zirconium oxynitride, a zirconium oxide silicate, a zirconium oxynitride silicate, an aluminum oxide, an aluminum oxynitride, and a silicon oxynitride. The first gate insulating layer 18a, the second gate insulating layer 18b, and the third gate insulating layer 18c may be a stacked structure in which two or more of layers of, for example, a hafnium oxide, a hafnium oxynitride, a hafnium oxide silicate, a hafnium oxynitride silicate, a zirconium oxide, a zirconium oxynitride, a zirconium oxide silicate, a zirconium oxynitride silicate, an aluminum oxide, an aluminum oxynitride, a silicon oxide, a silicon oxynitride, and the like are stacked.

The face of the silicon carbide layer 10 in portions in which the first gate insulating layer 18a, the second gate insulating layer 18b, and the third gate insulating layer 18c are in contact with the first p-well region 30a and the second p-well region 30b is, for example, a plane inclined at 0 degrees or more and 10 degrees or less with respect to the m-face.

The pad insulating layer 22 is provided between the first plane P1 and the first gate insulating layer 18a, the second gate insulating layer 18b, and the third gate insulating layer 18c. The pad insulating layer 22 is, for example, a silicon oxide. For example, a high dielectric material having a dielectric constant higher than that of the silicon oxide can be used for the pad insulating layer 22.

The interlayer insulating layer 24 is formed on the first gate electrode 20a, the second gate electrode 20b, and the third gate electrode 20c. The interlayer insulating layer 24 is, for example, a silicon oxide.

The source electrode 12 is located on the side of silicon carbide layer 10 closer to the first plane P1. The source electrode 12 is in contact with first source region 32a and second source region 32b. The source electrode 12 is electrically connected to first source region 32a and second source region 32b.

The source electrode 12 is in contact with the p-well contact region 34. The source electrode 12 is electrically connected to the p-well contact region 34. The source electrode 12 also functions as a p-well electrode for applying a potential to the first p-well region 30a and the second p-well region 30b.

The source electrode 12 is configured as a stacked layer of, for example, a barrier metal layer of nickel (Ni) and a metal layer of aluminum on the barrier metal layer. The barrier metal layer of nickel and the silicon carbide layer 10 may react with each other to form a nickel silicide. The nickel silicide is, for example, NiSi or $Ni_2Si$. The barrier metal layer of nickel and the metal layer of aluminum may react with each other to form an alloy.

The drain electrode 14 is located on the side of the silicon carbide layer 10 closer to the second plane P2. The drain electrode 14 is in contact with the drain region 26. The drain electrode 14 is electrically connected to the drain region 26.

The drain electrode 14 is, for example, nickel. The nickel may react with the silicon carbide layer 10 to form a nickel silicide. The nickel silicide is, for example, NiSi or $Ni_2Si$.

In the semiconductor device according to the first embodiment, the n-type impurity is, for example, nitrogen or phosphorus. It is also possible to employ arsenic (As) or antimony (Sb) as n-type impurities.

In the semiconductor device according to the first embodiment, the p-type impurity is, for example, aluminum. It is also possible to employ boron (B), gallium (Ga), or indium (In) as p-type impurities.

The impurity concentration in the silicon carbide layer 10 can be measured by, for example, secondary ion mass spectrometry (SIMS). In addition, the conductivity types of the impurities and the magnitude relationship of the impurity concentrations in the silicon carbide layer 10 can be measured by, for example, scanning capacitance microscopy (SCM).

Next, the functions and effects of the vertical transistor 100 according to the first embodiment will be described.

In the case of forming a metal oxide semiconductor field effect transistor (MOSFET) by using silicon carbide, there is a problem in that it is difficult to reduce on-resistance. There is a method of reducing the on-resistance by employing a trench gate structure and increasing a channel density. However, in the case of the trench gate structure, there is a problem in that the electric field strength applied to the gate insulating layer becomes high particularly at corners of the trench, and the reliability of the gate insulating layer is lowered. Therefore, it is desirable to have a MOSFET structure in which the reduction of the on-resistance and the improvement of the reliability of the gate insulating layer are compatible.

In the vertical transistor 100, by applying a turn-on voltage higher than a threshold voltage to the first gate electrode 20a, the second gate electrode 20b, and the third gate electrode 20c in a state where a positive voltage is applied to the drain electrode 14 with respect to the source electrode 12, the on-current flows.

Electrons as carriers flow, for example, from the source electrode 12 to the JFET region 36 through inversion layers formed in the first p-well regions 30a on both sides of the first trench 16a. The electrons flow in the second direction parallel to the first plane P1. The first p-well regions 30a on both side faces of the first trench 16a become channel regions.

The electrons having entered the JFET region 36 flow, for example, in the JFET region 36 between the first trench 16a and the second trench 16b toward the drain electrode 14. The electrons pass through the drift region 28 and the drain region 26 to reach the drain electrode 14.

In the vertical transistor 100, for example, the first p-well regions 30a on both side faces of the first trench 16a become the channel width of the MOSFET. For example, by allowing the depth of the first trench 16a to be large, the channel width becomes wider, and thus, the on-resistance is further reduced.

In the vertical transistor 100, the first trenches 16a, the second trenches 16b, and the third trenches 16c are arranged at a constant pitch in the first direction. For example, by shortening the pitch of the arrangement of the first trenches 16a, the second trenches 16b, and the third trenches 16c, the channel density is increased, and thus, the on-resistance is further reduced.

Therefore, according to the vertical transistor 100, the on-resistance can be reduced.

In addition, in the vertical transistor 100, the bottom of the trench is covered with a p-type region. Therefore, the electric field strength applied to the gate insulating layer at the bottom of the trench is relaxed.

For example, the bottom of the first trench 16a is covered with the first electric field relaxation region 38a. Therefore, even in a state where the vertical transistor 100 is in a turn-off state and a high voltage is applied to the drain electrode 14 with respect to the source electrode 12, the electric field strength applied to the first gate insulating layer at the bottom of the first trench 16a is relaxed.

In addition, when the vertical transistor 100 is in the turn-off state, an n-type region between two p-type regions is depleted in a depletion layer extending from the p-type region at the bottom of the trench. Therefore, the electric field strength applied to the gate insulating layer on the side face of the trench is relaxed.

For example, the drift region 28 between the first electric field relaxation region 38a and the second electric field relaxation region 38b is depleted in a depletion layer extending from the first electric field relaxation region 38a at the bottom of the first trench 16a and the second electric field relaxation region 38b at the bottom of the second trench 16b. Therefore, the electric field strength applied to the first gate insulating layer 18a on the side face of the first trench 16a and the second gate insulating layer 18b on the side face of the second trench 16b is relaxed.

Therefore, according to the vertical transistor 100, the reliability of the gate insulating layer can be improved.

Furthermore, since the n-type region between the two p-type regions is depleted in the depletion layer extending from the p-type region at the bottom of the trench, the n-type impurity concentration of the JFET region 36 between the two trenches can be increased. This is because, due to the depletion of the n-type region between the two p-type regions, the electric field strength applied to the gate insulating layer on the side face of the trench is relaxed even if the n-type impurity concentration in JFET region 36 is increased.

By increasing the n-type impurity concentration of JFET region 36, the on-resistance of the vertical transistor 100 can be further reduced.

From the viewpoint of reducing the on-resistance, the n-type impurity concentration of the JFET region 36 is preferably twice or more, more preferably five times or more, and still more preferably ten times or more the n-type impurity concentration of the drain region 26.

From the viewpoint of reducing the electric field strengths applied to the first gate insulating layer 18a, the second gate insulating layer 18b, and the third gate insulating layer 18c, it is preferable that the p-type impurity concentrations of the first electric field relaxation region 38a, the second electric field relaxation region 38b, and the third electric field relaxation region 38c are higher than the p-type impurity concentrations of the first p-well region 30a and the second p-well region 30b. In addition, from the viewpoint of reducing the electric field strengths applied to the first gate insulating layer 18a, the second gate insulating layer 18b, and the third gate insulating layer 18c, it is preferable that the p-type impurity concentrations of the first electric field relaxation region 38a, the second electric field relaxation region 38b, and the third electric field relaxation region 38c are $1\times10^{18}$ cm$^{-3}$ or more.

In addition, from the viewpoint of suppressing the increase in resistance of the drift region 28 between the two electric field relaxation regions in the turn-on state of the vertical transistor 100, and suppressing the increase in on-resistance, it is preferable that the p-type impurity concentrations of the first electric field relaxation region 38a, the second electric field relaxation region 38b, and the third electric field relaxation region 38c is $1\times10^{22}$ cm$^{-3}$ or less.

It is preferable that the first electric field relaxation region 38a, the second electric field relaxation region 38b, and the third electric field relaxation region 38c contain aluminum (Al) and boron (B) as p-type impurities. For example, at the time of forming the electric field relaxation region at the bottom of the trench by ion implantation, the electric field relaxation region can be easily extended in the side-face direction of the trench by co-doping boron with fast thermal diffusion with aluminum. If the boron diffusion is used, it is not necessary to perform, for example, oblique ion implantation, and thus, it is possible to cope with a narrow-pitch trench structure or a high-aspect-ratio trench structure.

By extending the electric field relaxation region provided at the bottom of the trench in the side-face direction of the trench, the breakdown voltage of the gate insulating layer is improved. However, if the electric field relaxation region is extended too much, the on-current is reduced. Therefore, the amount of extension of the electric field relaxation region due to the diffusion of the p-type impurities is preferably 40% or less of the trench width. For example, if the trench width is 0.5 µm, it is preferable that the amount of extension of the electric field relaxation region is preferably 0.1 µm or less on both sides, and thus, the total amount is 0.2 µm or less.

The vertical transistor 100 preferably includes a first current diffusion region 40. Since the first current diffusion region 40 is provided, electrons flowing from the JFET region 36 to the drift region 28 in the turn-on state of the vertical transistor 100 spread laterally in the first current diffusion region 40 having a low resistance. For this reason, the on-resistance of the vertical transistor 100 is further reduced.

The depths of the first trench 16a, the second trench 16b, and the third trench 16c are preferably smaller than the depths of, for example, the first source region 32a and the second source region 32b. In other words, the depths of the first source region 32a and the second source region 32b are preferably larger than the depths of the first trench 16a, the second trench 16b, and the third trench 16c. The contact area between the first source region 32a and the first p-well region 30a and the contact area between the second source region 32b and the second p-well region 30b are increased, so that the on-resistance of the vertical transistor 100 can be reduced.

The depths of the first trench 16a, the second trench 16b, and the third trench 16c are the channel widths. Thus, as the depth is increased, the on-resistance is reduced.

In the structure of the vertical transistor 100 in which the entire channel in the channel depth direction can be used as the channel, as the depth is increased, the low on-resistance can be realized. In a general double implantation MOSFET (DiMOSFET), the Si face is used as a channel. Since the mobility of the vertical transistor 100 having the m-face as a channel increases by about twice, if the channel width (the depth of the trench in the structure of the vertical transistor 100) is half or more of that of a general DiMOSFET, the on-resistance is about the same as that of the DiMOSFET. Therefore, if a trench structure having an aspect ratio of 0.5 times or more can be formed, the reduction in on-resistance can be expected.

In a case where a trench is formed with 0.5 µm lines and spaces, a trench having a depth of 0.25 µm or more which has an aspect ratio of 0.5 is appropriate. For example, if a trench having a depth of a 1.5 µm which has an aspect ratio of 3 can be used, a current of six times flows. For example, if a trench having a depth of a 2.5 µm which has an aspect ratio of 5 can be used, a current of 10 times flows.

As described above, in the vertical transistor 100, the breakdown voltage structure of the gate insulating layer is configured with the p-type electric field relaxation region which is formed at the bottom of the line and space. For this reason, the vertical transistor 100 has a structure in which the entire side face of the deep trench is defined as a channel, and thus, the on-current flows into the JFET region 36 at one time without current narrowing. For this reason, as the trench is formed to be deeper, the channel width can be further widened, and thus, the more on-current can be acquired. As a result, as the trench depth is increased, the on-resistance can be reduced.

In the vertical transistor 100, since there is current constriction between the electric field relaxation regions, a mechanism for suppressing a large current at the time of erroneous ignition works. Therefore, it is possible to significantly increase the short circuit withstand capability, and it is possible to secure the short circuit withstand capability of, for example, 10 µsec or more.

Heretofore, according to the first embodiment, it is possible to realize a semiconductor device in which the reduction of the on-resistance and the improvement of the reliability of the gate insulating layer are compatible.

Second Embodiment

A semiconductor device according to a second embodiment is different from the first embodiment in that the semiconductor device according to the second embodiment further includes a tenth semiconductor region of the first conductivity type being provided between the first semiconductor region and the sixth semiconductor region and having a first conductivity type impurity concentration higher than that of the first semiconductor region and an eleventh semiconductor region of the first conductivity type being provided between the tenth semiconductor region and the sixth semiconductor region and having a first conductivity type impurity concentration lower than that of the tenth semiconductor region. Hereinafter, the description of the same contents as those of the first embodiment will be partially omitted.

Hereinafter, a case where the semiconductor layer is a silicon carbide will be described as an example. In addition, a case where the first conductivity type is n-type and the second conductivity type is p-type will be described as an example.

Figure 7:
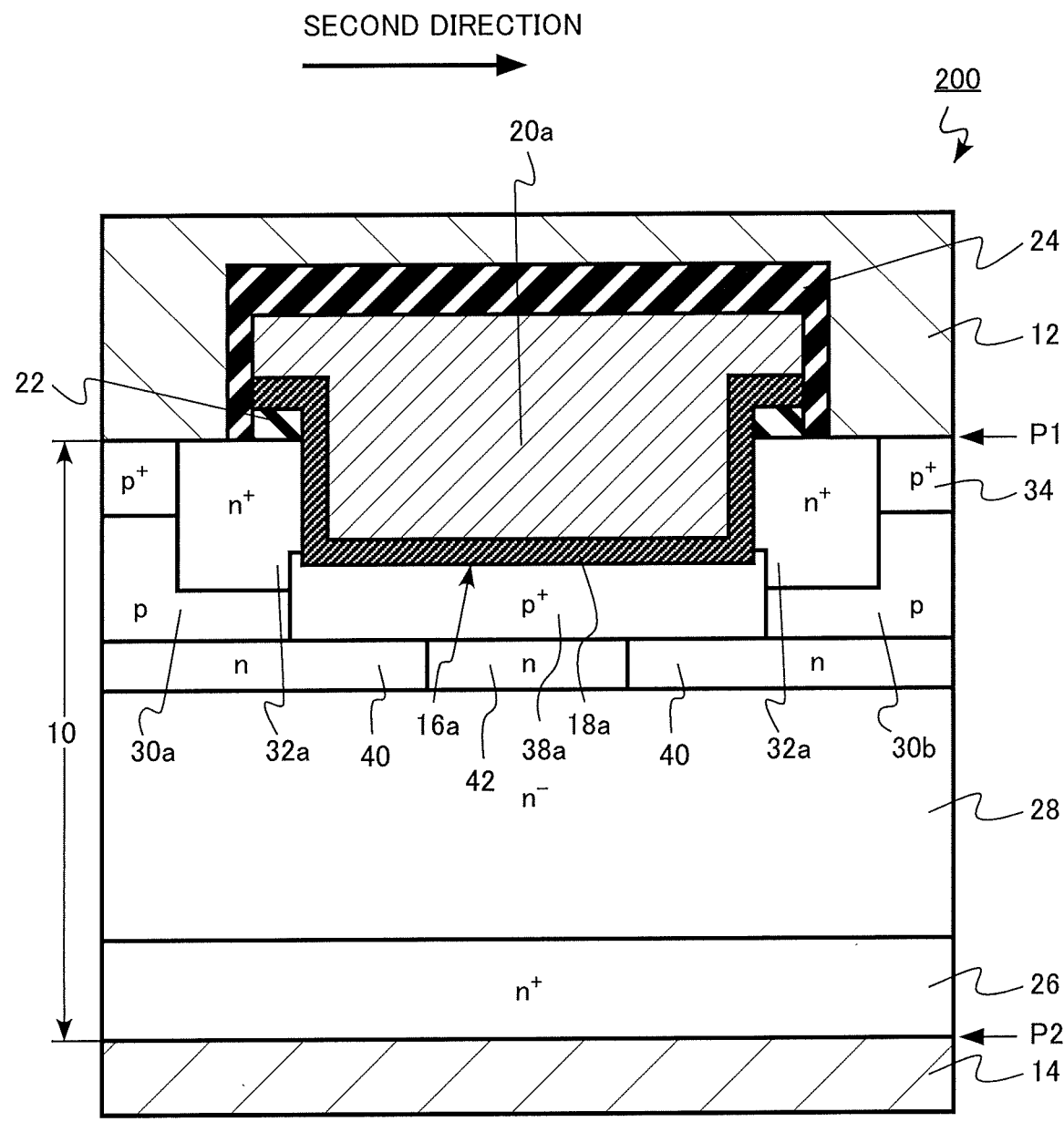
FIG. 7 is a schematic cross-sectional view of a semiconductor device according to a second embodiment.

FIG. 7 is a schematic cross-sectional view of the semiconductor device according to the second embodiment. FIG. 7 illustrates a cross section corresponding to FIG. 1 of the first embodiment.

The semiconductor device according to the second embodiment is a trench gate type vertical transistor 200 having a gate electrode in a trench. The vertical transistor 200 is a MOSFET with a fin structure in which the gate electrode is provided on a side surface of a narrow portion of the semiconductor layer. The vertical transistor 200 is a transistor having electrons as carriers.

Figure 8:
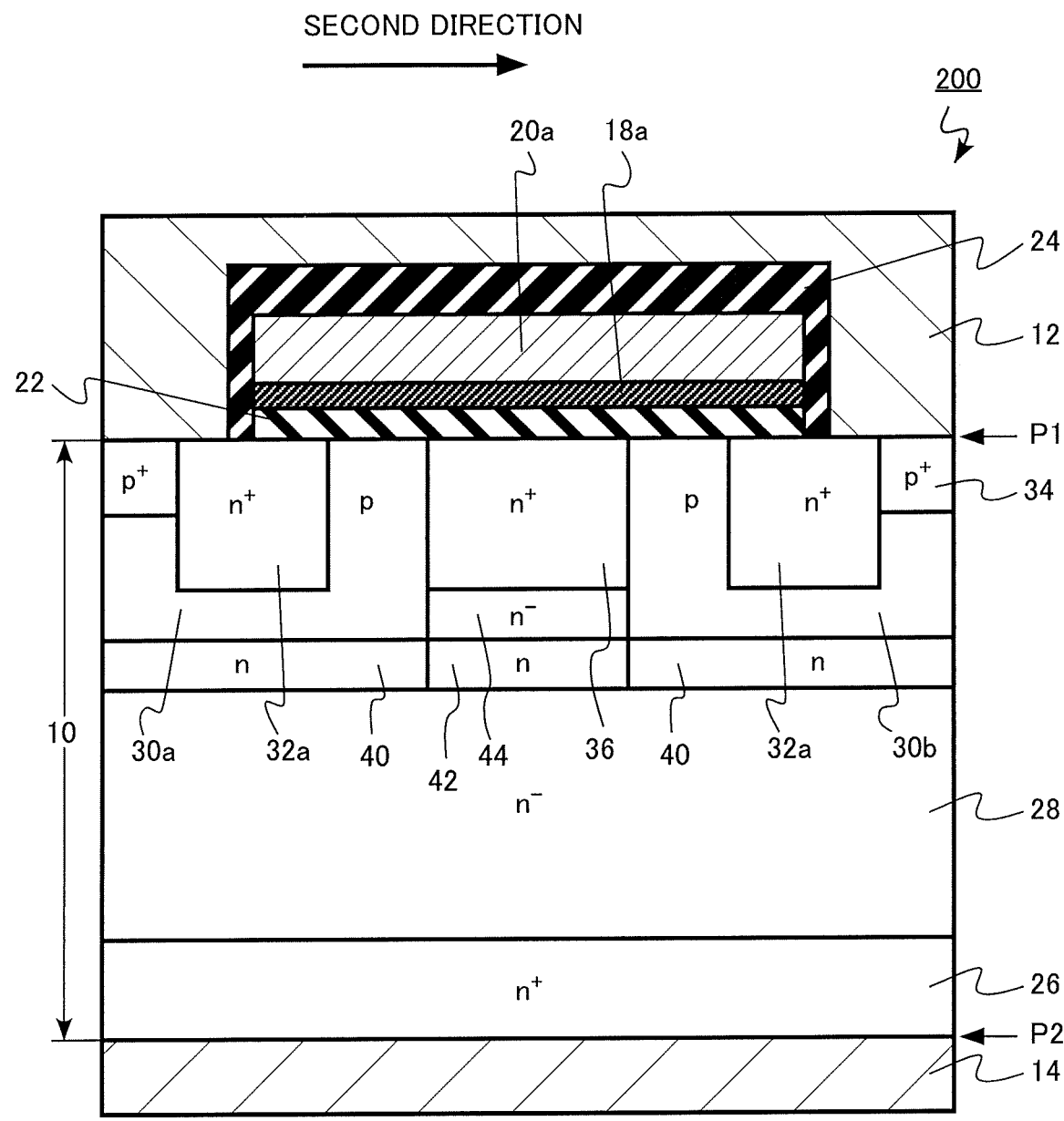
FIG. 8 is a schematic cross-sectional view of the semiconductor device according to the second embodiment.

FIG. 8 is a schematic cross-sectional view of the semiconductor device according to the second embodiment. FIG. 8 illustrates a cross section corresponding to FIG. 3 of the first embodiment.

Figure 9:
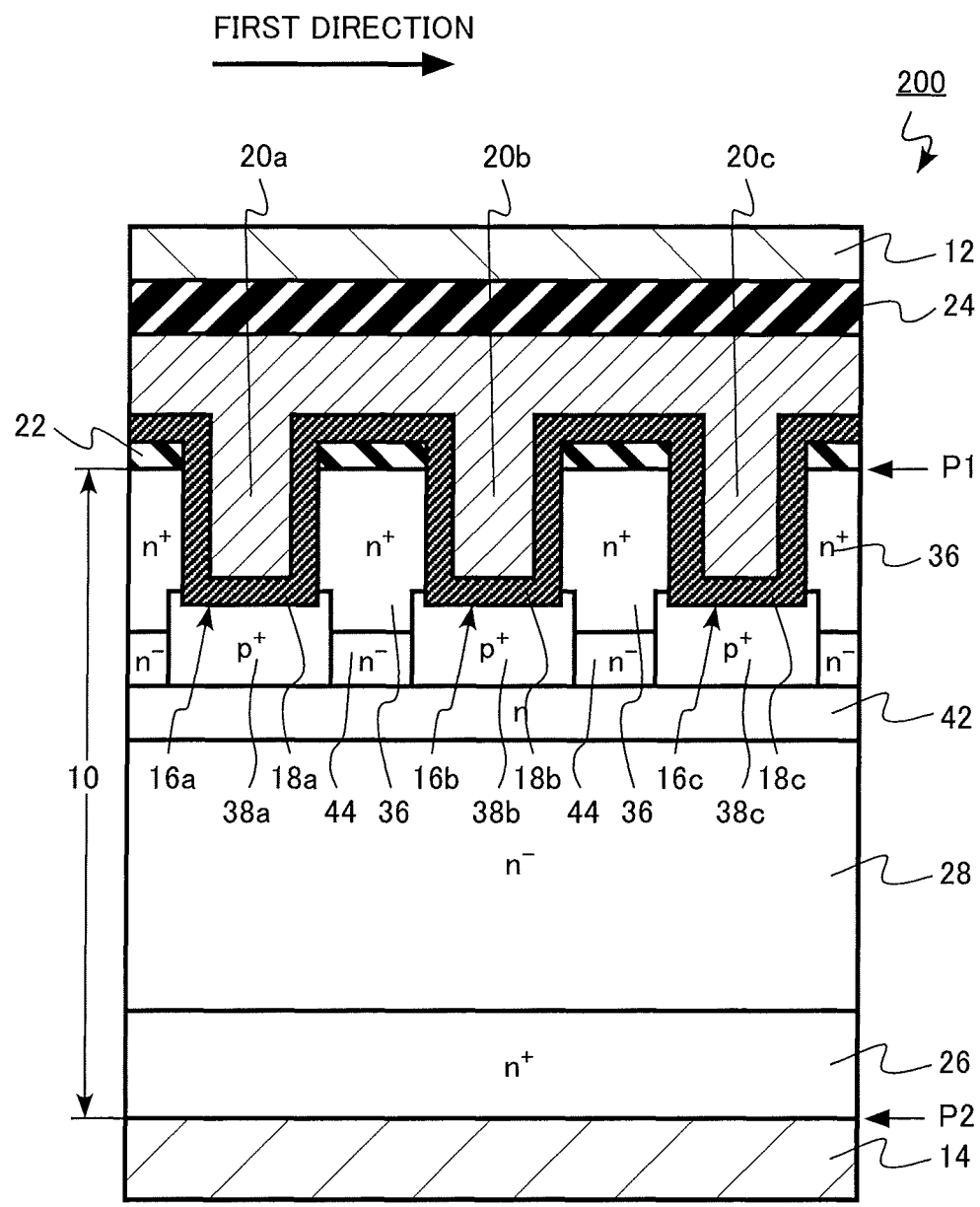
FIG. 9 is a schematic cross-sectional view of the semiconductor device according to the second embodiment.

FIG. 9 is a schematic cross-sectional view of the semiconductor device according to the second embodiment. FIG. 9 illustrates a cross section corresponding to FIG. 5 of the first embodiment.

The vertical transistor 200 includes a silicon carbide layer 10 (semiconductor layer), a source electrode 12 (first electrode), a drain electrode 14 (second electrode), a first trench 16a, a second trench 16b, a third trench 16c, a first gate insulating layer 18a, a second gate insulating layer 18b, a third gate insulating layer 18c, a first gate electrode 20a, a second gate electrode 20b, a third gate electrode 20c, a pad insulating layer 22, and an interlayer insulating layer 24.

A drain region 26, a drift region 28 (first semiconductor region), a first p-well region 30a (second semiconductor region), a second p-well region 30b (third semiconductor region), a first source region 32a (fourth semiconductor region), a second source region 32b (fifth semiconductor region), a p-well contact region 34, a JFET region 36 (sixth semiconductor region), a first electric field relaxation region 38a (seventh semiconductor region), a second electric field relaxation region 38b (eighth semiconductor region), a third electric field relaxation region 38c, a first current diffusion region 40 (ninth semiconductor region), a second current diffusion region 42 (tenth semiconductor region), and a depletion region 44 (eleventh semiconductor region) exist in the silicon carbide layer 10.

The second current diffusion region 42 is an n-type SiC. The second current diffusion region 42 is located between the drift region 28 and the JFET region 36.

The second current diffusion region 42 contains, for example, nitrogen (N) or phosphorus (P) as n-type impurities. The n-type impurity concentration of the second current diffusion region 42 is, for example, $2 \times 10^{15}$ cm$^{-3}$ or more and $5 \times 10^{16}$ cm$^{-3}$ or less. The n-type impurity concentration of the second current diffusion region 42 is higher than the n-type impurity concentration of the drift region 28.

The n-type impurity concentration of the JFET region 36 is higher than, for example, the n-type impurity concentration of the second current diffusion region 42.

The depletion region 44 is an n$^-$-type SiC. The depletion region 44 is located between second current diffusion region 42 and JFET region 36. The depletion region 44 is located between first electric field relaxation region 38a and second electric field relaxation region 38b. The depletion region 44 is located between second electric field relaxation region 38b and third electric field relaxation region 38c.

The depletion region 44 contains, for example, nitrogen (N) as n-type impurities. The n-type impurity concentration of the depletion region 44 is, for example, $1 \times 10^{15}$ cm$^{-3}$ or more and $2 \times 10^{16}$ cm$^{-3}$ or less. The n-type impurity concentration of the depletion region 44 is lower than the n-type impurity concentration of the second current diffusion region 42.

The vertical transistor 200 includes the second current diffusion region 42, and thus, electrons flowing from the JFET region 36 to the drift region 28 in the turn-on state of the vertical transistor 200 spread laterally in the second current diffusion region 42 having a low resistance. For this reason, the on-resistance of the vertical transistor 200 is reduced.

The vertical transistor 200 includes the depletion region 44 having a low n-type impurity concentration, and thus, in the turn-on state of the vertical transistor 200, the depletion layer easily extends, for example, between the first electric field relaxation region 38a and the second electric field relaxation region 38b. In addition, for example, the depletion layer easily extends between the second electric field relaxation region 38b and the third electric field relaxation region 38c. Therefore, the electric field strength applied to the first gate insulating layer 18a on the side face of the first trench 16a and the second gate insulating layer 18b on the side face of the second trench 16b is relaxed. Thus, according to the vertical transistor 100, the reliability of the gate insulating layer can be improved.

Heretofore, according to the second embodiment, similarly to the first embodiment, it is possible to realize a semiconductor device in which the reduction of the on-resistance and the improvement of the reliability of the gate insulating layer are compatible. According to the second embodiment, in comparison to the first embodiment, the on-resistance is further reduced, and the reliability of the gate insulating layer is improved.

Third Embodiment

A semiconductor device according to a third embodiment includes: a semiconductor layer having a first plane and a second plane facing the first plane; a first semiconductor region of a first conductivity type existing in the semiconductor layer; a second semiconductor region of a second conductivity type existing in the semiconductor layer and being located between the first semiconductor region and the first plane; a third semiconductor region of a second conductivity type existing in the semiconductor layer and being located between the first semiconductor region and the first plane; a first metal region existing in the semiconductor layer and being located between the second semiconductor region and the first plane; a second metal region existing in the semiconductor layer and being located between the third semiconductor region and the first plane; a first trench existing in the semiconductor layer and being located between the first metal region and the second metal region and over from the second semiconductor region to the third semiconductor region; a second trench existing in the semiconductor layer and being located between the first metal region and the second metal region and over from the second semiconductor region to the third semiconductor region; a twelfth semiconductor region of a first conductivity type existing in the semiconductor layer, being located between the first semiconductor region and the first plane, and being located between the second semiconductor region and the third semiconductor region and between the first trench and the second trench; a thirteenth semiconductor region of a second conductivity type existing in the semiconductor layer, being located between the first trench and the first semiconductor region, and being in contact with the second semiconductor region and the third semiconductor region; a fourteenth semiconductor region of a second conductivity type existing in the semiconductor layer, being located between the second trench and the first semiconductor region, and being in contact with the second semiconductor region and the third semiconductor region; a first gate electrode located in the first trench; a second gate electrode located in the second trench; a first gate insulating layer located between the first gate electrode and the second semiconductor region and between the first gate electrode and the third semiconductor region; a second gate insulating layer located between the second gate electrode and the second semiconductor region and between the second gate electrode and the third semiconductor region; a first electrode located on a side of the semiconductor layer closer to the first plane; and a second electrode located on a side of the semiconductor layer closer to the second plane.

The vertical transistor 300 is different from the vertical transistor 100 according to the first embodiment in that the source region is not a semiconductor but a metal. The term "metal" in this specification also includes a metal semiconductor compound having characteristics as a metal.

Hereinafter, a case where the semiconductor layer is a silicon carbide will be described as an example. In addition, a case where the first conductivity type is n-type and the second conductivity type is p-type will be described as an example.

Figure 10:
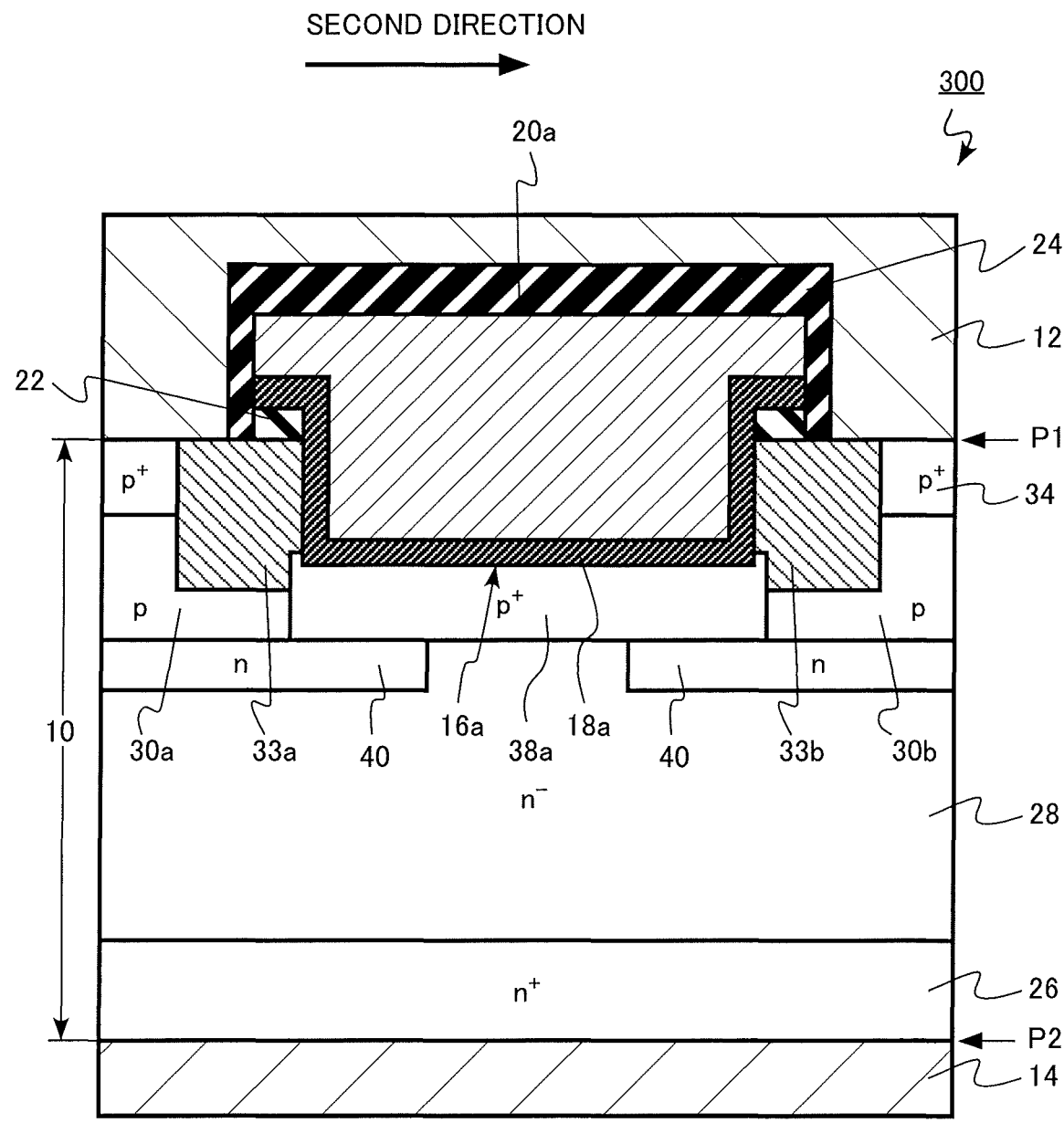
FIG. 10 is a schematic cross-sectional view of a semiconductor device according to a third embodiment.

FIG. 10 is a schematic cross-sectional view of the semiconductor device according to the third embodiment. FIG. 10 illustrates a cross section corresponding to FIG. 1 of the first embodiment.

The semiconductor device according to the third embodiment is a trench gate type vertical transistor 300 having a gate electrode in a trench. The vertical transistor 300 is a MOSFET with a fin structure in which the gate electrode is provided on a side surface of a narrow portion of the semiconductor layer. The vertical transistor 300 is a transistor having electrons as carriers.

Figure 11:
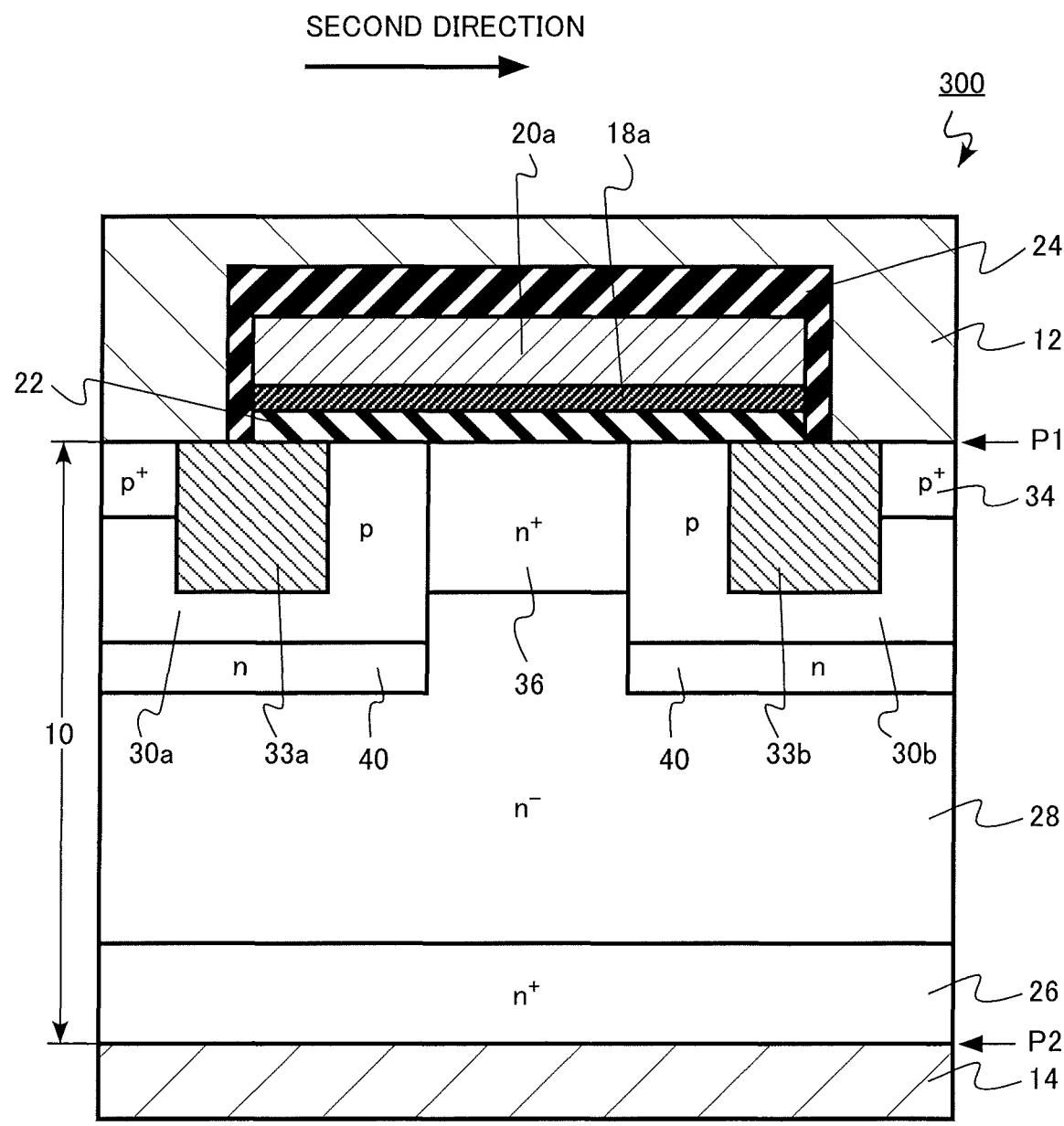
FIG. 11 is a schematic cross-sectional view of the semiconductor device according to the third embodiment.

FIG. 11 is a schematic cross-sectional view of the semiconductor device according to the third embodiment. FIG. 11 illustrates a cross section corresponding to FIG. 3 of the first embodiment.

The vertical transistor 300 includes a silicon carbide layer 10 (semiconductor layer), a source electrode 12 (first electrode), a drain electrode 14 (second electrode), a first trench 16a, a second trench 16b, a third trench 16c, a first gate insulating layer 18a, a second gate insulating layer 18b, a third gate insulating layer 18c, a first gate electrode 20a, a second gate electrode 20b, a third gate electrode 20c, a pad insulating layer 22, and an interlayer insulating layer 24.

A drain region 26, a drift region 28 (first semiconductor region), a first p-well region 30a (second semiconductor region), a second p-well region 30b (third semiconductor region), a first metal source region 33a (first metal region), a second metal source region 33b (second metal region), a p-well contact region 34, a JFET region 36 (twelfth semiconductor region), a first electric field relaxation region 38a (thirteenth semiconductor region), a second electric field relaxation region 38b (fourteenth semiconductor region), a third electric field relaxation region 38c, a first current diffusion region 40 (ninth semiconductor region), a second current diffusion region 42 (tenth semiconductor region), and a depletion region 44 exist in the silicon carbide layer 10.

The first metal source region 33a is a metal or a metal semiconductor compound. The first metal source region 33a is located between the first p-well region 30a and the first plane P1. A portion of the first metal source region 33a is in contact with the first plane P1. The first metal source region 33a is in contact with the first p-well region 30a. The first source region 32a extends in the first direction.

The first metal source region 33a is, for example, a metal silicide. The first metal source region 33a is, for example, a nickel silicide.

The depth of the first metal source region 33a is smaller than the depth of the first p-well region 30a. The depth of the first metal source region 33a is smaller than, for example, the first trench 16a. The depth of the first metal source region 33a can be, for example, 0.4 μm or more and 4.9 μm or less by burying silicon and reacting the silicon with nickel (Ni) or the like. The characteristics are improved by allowing the depth of the first metal source region 33a to be approximately the same as the depth of the trench 16a or to be longer than the depth of the trench 16a.

The second metal source region 33b is a metal or a metal semiconductor compound. The second metal source region 33b is located between the second p-well region 30b and the first plane P1. A portion of the second metal source region 33b is in contact with the first plane P1. The second metal source region 33b is in contact with the second p-well region 30b. The second metal source region 33b extends in the first direction.

The second metal source region 33b is, for example, a metal silicide. The second metal source region 33b is, for example, a nickel silicide.

The depth of the second metal source region 33b is smaller than the depth of the second p-well region 30b. The depth of the second metal source region 33b is smaller than, for example, the first trench 16a. The depth of the second metal source region 33b can be set to a depth of 0.4 μm to 4.9 μm, for example, by burying silicon and reacting silicon with nickel (Ni). The characteristics are improved by allowing the depth of the metal source region 33b to be substantially the same as the depth of the trench 16a or to be longer than the depth of the trench 16a.

The vertical transistor 300 includes the first metal source region 33a and the second metal source region 33b, so that the parasitic resistance of the source is reduced. Therefore, the on-resistance is reduced.

Heretofore, according to the third embodiment, similarly to the first embodiment, it is possible to realize a semiconductor device in which the reduction of the on-resistance and the improvement of the reliability of the gate insulating layer are compatible. According to the third embodiment, in comparison to the first embodiment, the on-resistance is further reduced.

Fourth Embodiment

A semiconductor device according to a fourth embodiment includes: a semiconductor layer having a first plane and a second plane facing the first plane; a first semiconductor region of a first conductivity type existing in the semiconductor layer; a second semiconductor region of a second conductivity type existing in the semiconductor layer and being located between the first semiconductor region and the first plane; a third semiconductor region of a second conductivity type existing in the semiconductor layer and being located between the first semiconductor region and the first plane; a first metal region existing in the semiconductor layer and being located between the second semiconductor region and the first plane; a second metal region existing in the semiconductor layer and being located between the third semiconductor region and the first plane; a first trench existing in the semiconductor layer and being located between the first metal region and the second metal region and over from the second semiconductor region to the third semiconductor region; a second trench existing in the semiconductor layer and being located between the first metal region and the second metal region and over from the second semiconductor region to the third semiconductor region; a third metal region existing in the semiconductor layer, being located between the first semiconductor region and the first plane, and being located between the second semiconductor region and the third semiconductor region and between the first trench and the second trench; a thirteenth semiconductor region of a second conductivity type, existing in the semiconductor layer, being located between the first trench and the first semiconductor region, and being in contact with the second semiconductor region and the third semiconductor region; a fourteenth semiconductor region of a second conductivity type existing in the semiconductor layer, being located between the second trench and the first semiconductor region, and being in contact with the second semiconductor region and the third semiconductor region; a first gate electrode located in the first trench; a second gate electrode located in the second trench; a first gate insulating layer located between the first gate electrode and the second semiconductor region and between the first gate electrode and the third semiconductor region; a second gate insulating layer located between the second gate electrode and the second semiconductor region and between the second gate electrode and the third semiconductor region; a first electrode located on a side of the semiconductor layer closer to the first plane; and a second electrode located on a side of the semiconductor layer closer to the second plane.

The vertical transistor 400 is different from the vertical transistor 300 according to the third embodiment in that the JFET region is not a semiconductor but a metal. The term "metal" in this specification also includes a metal semiconductor compound having characteristics as a metal.

Hereinafter, a case where the semiconductor layer is a silicon carbide will be described as an example. In addition, a case where the first conductivity type is n-type and the second conductivity type is p-type will be described as an example.

Figure 12:
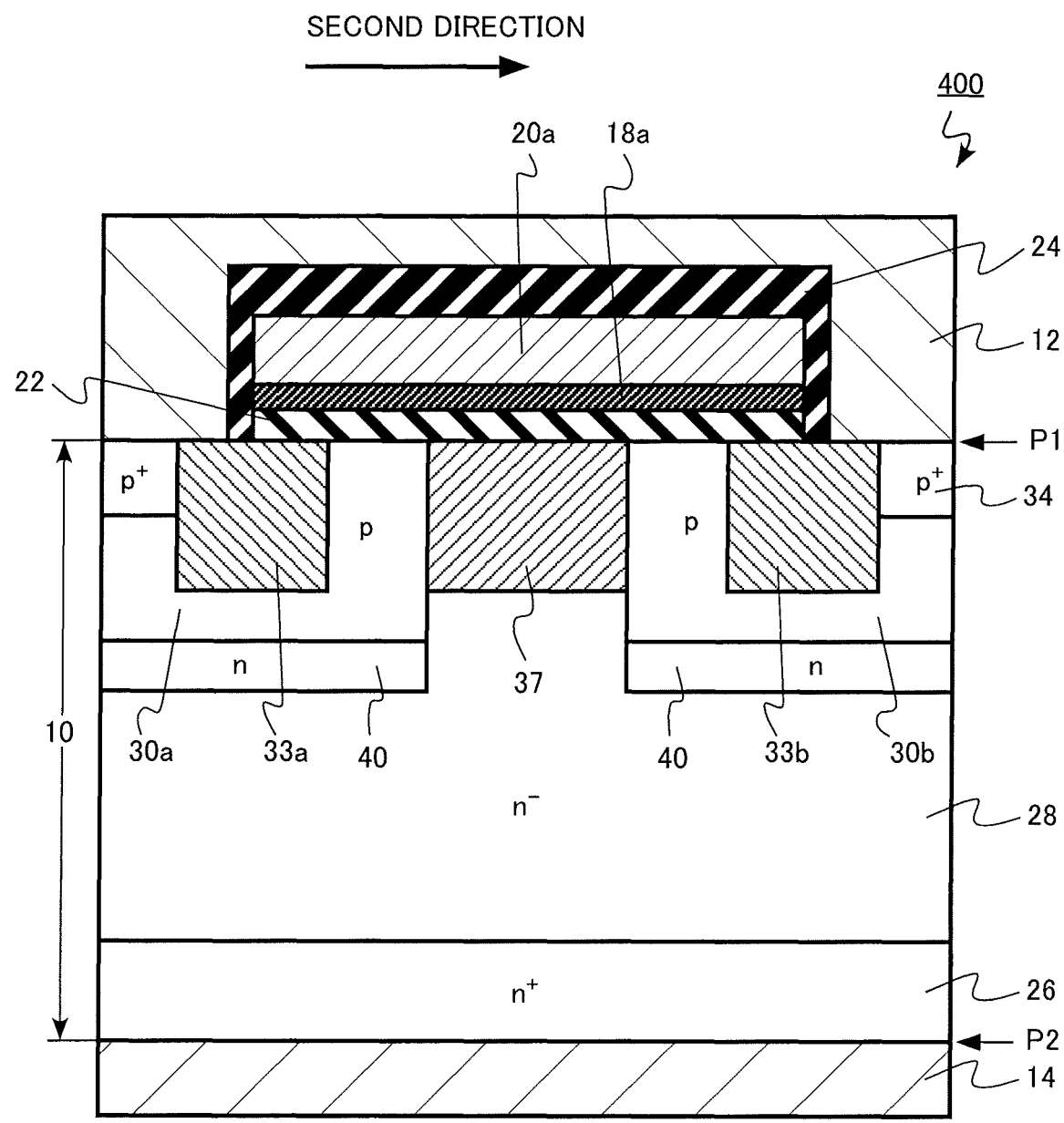
FIG. 12 is a schematic cross-sectional view of a semiconductor device according to a fourth embodiment.

FIG. 12 is a schematic cross-sectional view of the semiconductor device according to the fourth embodiment. FIG. 12 illustrates a cross section corresponding to FIG. 1 of the first embodiment.

The semiconductor device according to the fourth embodiment is a trench gate type vertical transistor 400 having a gate electrode in a trench. The vertical transistor 400 is a MOSFET with a fin structure in which the gate electrode is provided on a side surface of a narrow portion of the semiconductor layer. The vertical transistor 400 is a transistor having electrons as carriers.

The vertical transistor 400 includes a silicon carbide layer 10 (semiconductor layer), a source electrode 12 (first electrode), a drain electrode 14 (second electrode), a first trench 16a, a second trench 16b, a third trench 16c, a first gate insulating layer 18a, a second gate insulating layer 18b, a third gate insulating layer 18c, a first gate electrode 20a, a second gate electrode 20b, a third gate electrode 20c, a pad insulating layer 22, and an interlayer insulating layer 24.

A drain region 26, a drift region 28 (first semiconductor region), a first p-well region 30a (second semiconductor region), a second p-well region 30b (third semiconductor region), a first metal source region 33a (first metal region), a second metal source region 33b (second metal region), a p-well contact region 34, a metal JFET region 37 (third metal region), a first electric field relaxation region 38a (thirteenth semiconductor region), a second electric field relaxation region 38b (fourteenth semiconductor region), a third electric field relaxation region 38c, a first current diffusion region 40 (ninth semiconductor region), a second current diffusion region 42 (tenth semiconductor region), and a depletion region 44 exist in the silicon carbide layer 10.

The metal JFET region 37 is a metal or a metal semiconductor compound. The metal JFET region 37 is located between the drift region 28 and the first plane P1. The metal JFET region 37 is located between the first p-well region 30a and the second p-well region 30b. The metal JFET region 37 is located between the first trench 16a and the second trench 16b.

The metal JFET region 37 is, for example, a metal silicide. The first metal source region 33a is, for example, a nickel silicide.

The depth of the metal JFET region 37 is smaller than the depths of the first p-well region 30a and the second p-well region 30b. The depth of the metal JFET region 37 can be, for example, 0.4 µm or more and 4.9 µm or less by burying silicon and reacting the silicon with nickel (Ni) or the like. The characteristics are improved by allowing the depth of the metal JFET region 37 to be longer than the depth of the trench 16a or to be substantially the same as the depth of the trench 16a. At this time, the depth of the metal JFET region 37 is set to be smaller than the depths of the bottoms of the first electric field relaxation region 38a (thirteenth semiconductor region), the second electric field relaxation region 38b (fourteenth semiconductor region), and the third electric field relaxation region 38c.

The first metal source region 33a, the second metal source region 33b, and the metal JFET region 37 can also be formed by, for example, simultaneous ion implantation of magnesium (Mg) and silicon (Si) with high energy. By simultaneous ion implantation and subsequent heat treatment, a semiconductor SiC can be converted into a metal SiC having a low work function.

The vertical transistor 400 includes the metal JFET region 37, so that the parasitic resistance of the drain is reduced. Therefore, the on-resistance is reduced.

Heretofore, according to the fourth embodiment, similarly to the first and third embodiments, it is possible to realize a semiconductor device in which the reduction of the on-resistance and the improvement of the reliability of the gate insulating layer are compatible. According to the third embodiment, in comparison to the first and third embodiments, the on-resistance is further reduced.

Fifth Embodiment

An inverter circuit and a driving device according to a fifth embodiment are a driving device provided with a semiconductor device according to the first embodiment.

Figure 13:
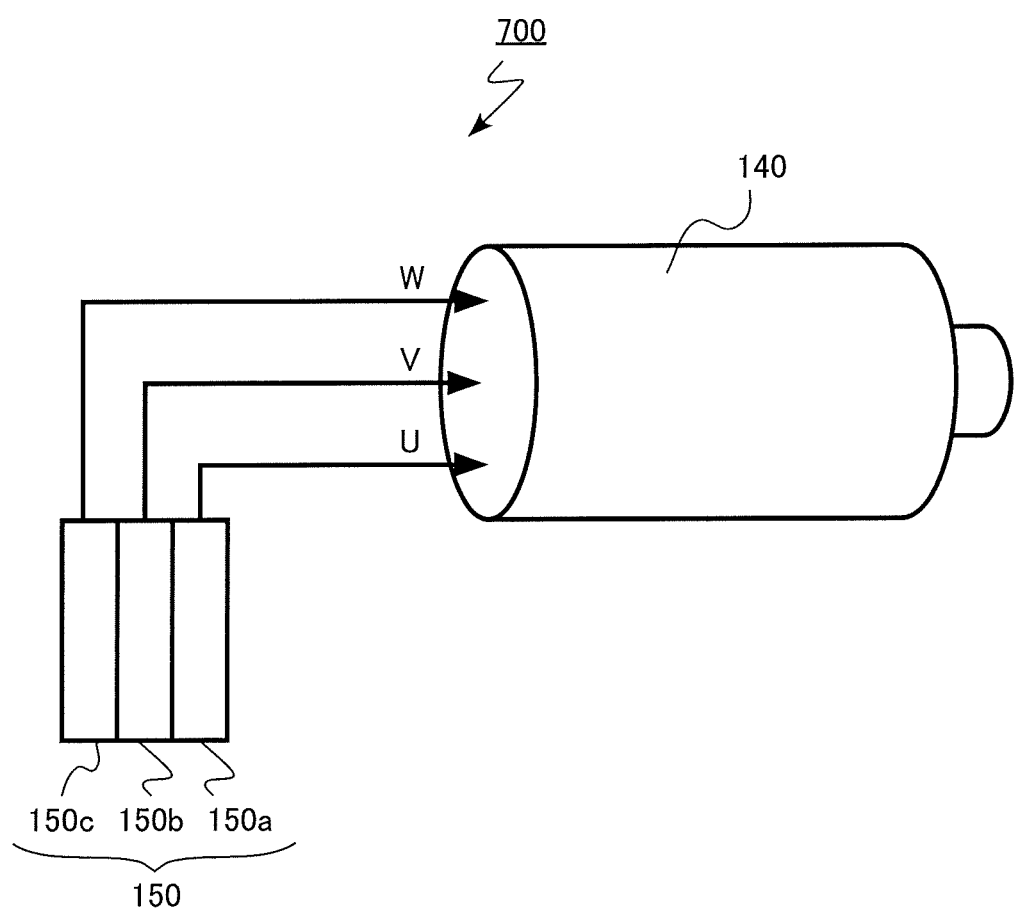
FIG. 13 is a schematic view of a driving device according to a fifth embodiment.

FIG. 13 is a schematic view of a driving device according to the fifth embodiment. The driving device 700 includes a motor 140 and an inverter circuit 150.

The inverter circuit 150 is configured with three semiconductor modules 150a, 150b, and 150c in which the vertical transistor 100 according to the first embodiment is used as a switching element. The three semiconductor modules 150a, 150b, and 150c are connected with each other in parallel, so that a three-phase inverter circuit 150 including three AC voltage output terminals U, V, and W is realized. The motor 140 is driven by the AC voltage output from the inverter circuit 150.

According to the fifth embodiment, the vertical transistor 100 with the improved characteristics is provided, so that the characteristics of the inverter circuit 150 and the driving device 700 are improved.

Sixth Embodiment

A vehicle according to a sixth embodiment is a vehicle provided with the semiconductor device according to the first embodiment.

Figure 14:
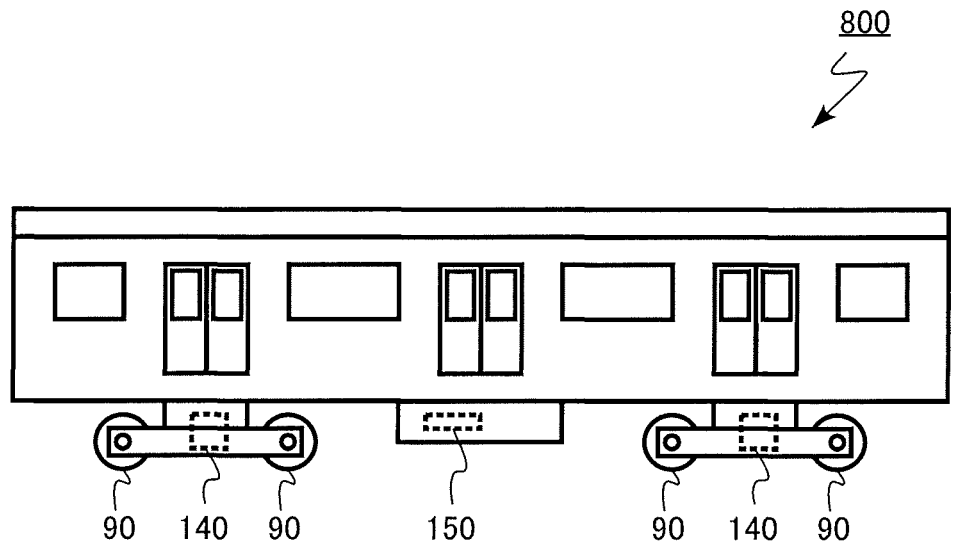
FIG. 14 is a schematic view of a vehicle according to a sixth embodiment.

FIG. 14 is a schematic view of a vehicle according to the sixth embodiment. The vehicle 800 according to the sixth embodiment is a railroad vehicle. The vehicle 800 includes a motor 140 and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized. The motor 140 is driven by the AC voltage output from the inverter circuit 150. The wheel 90 of the vehicle 800 is rotated by the motor 140.

According to the sixth embodiment, the vertical transistor 100 with improved characteristics is provided, so that the characteristics of the vehicle 800 are improved.

Seventh Embodiment

A vehicle according to a seventh embodiment is a vehicle provided with the semiconductor device according to the first embodiment.

Figure 15:
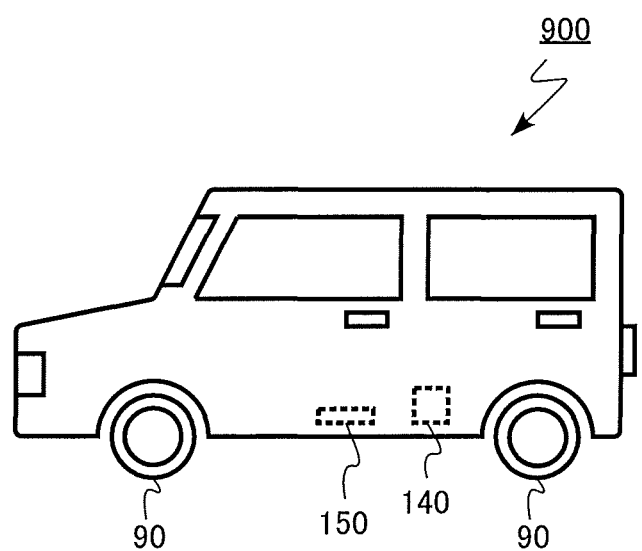
FIG. 15 is a schematic view of a vehicle according to a seventh embodiment.

FIG. 15 is a schematic view of the vehicle according to the seventh embodiment. The vehicle 900 according to the seventh embodiment is a car. The vehicle 900 includes a motor 140 and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized.

The motor 140 is driven by the AC voltage output from the inverter circuit 150. The wheel 90 of the vehicle 900 is rotated by the motor 140.

According to the seventh embodiment, the vertical transistor 100 with improved characteristics is provided, so that the characteristics of the vehicle 900 are improved.

Eighth Embodiment

An elevator according to an eighth embodiment is an elevator provided with the semiconductor device according to the first embodiment.

Figure 16:
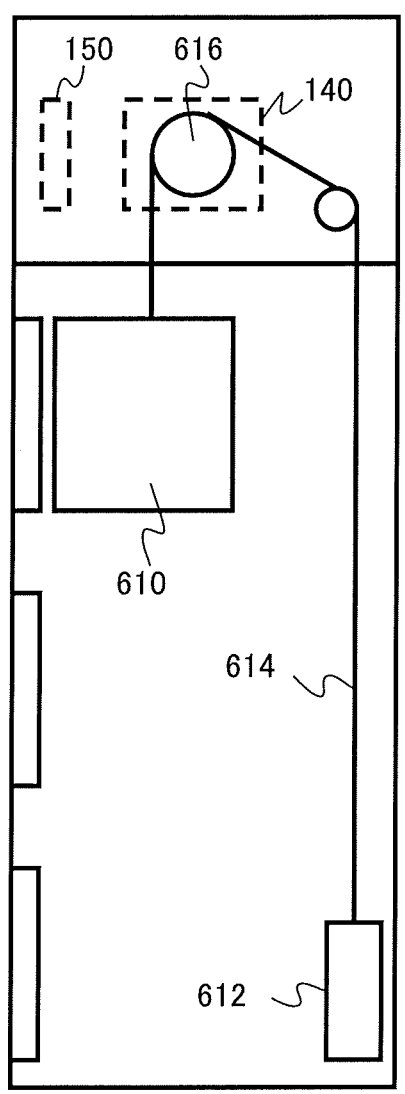
FIG. 16 is a schematic view of an elevator according to an eighth embodiment.

FIG. 16 is a schematic view of the elevator according to the eighth embodiment. The elevator 1000 according to the eighth embodiment includes a cage 610, a counterweight 612, a wire rope 614, a winding machine 616, a motor 140, and an inverter circuit 150.

The inverter circuit 150 is configured with three semiconductor modules in which the vertical transistor 100 according to the first embodiment is used as a switching element. The three semiconductor modules are connected with each other in parallel, so that a three-phase inverter circuit 150 including three AC voltage output terminals U, V, and W is realized.

The motor 140 is driven by the AC voltage output from the inverter circuit 150. The winding machine 616 is rotated by the motor 140, so that the cage 610 is lifted up and down.

According to the eighth embodiment, the vertical transistor 100 with the improved characteristics is provided, so that the characteristics of the elevator 1000 are improved.

Heretofore, in the first to fourth embodiments, a case where the silicon carbide is used for the semiconductor layer has been described as an example, but other semiconductors such as silicon and nitride semiconductors may be used for the semiconductor layer.

As described above, in the first to fourth embodiments, a case where the silicon carbide has a crystal structure of 4H—SiC has been described as an example, but the embodiments can also be applied to a silicon carbide having the crystal structure of 6H—SiC.

In addition, in the first to fourth embodiments, a case where the gate insulating layer is provided on the m-face has been described as an example, but the embodiments can also be applied to a case where a gate insulating layer is provided to other faces of, for example, a silicon face, an a-face, a (0-33-8)-face, and the like of the silicon carbide.

The embodiments can also be applied to n-channel insulated gate bipolar transistors (IGBTs).

In addition, the embodiments can be applied not only to an n-channel type transistor having electrons as carriers but also to a p-channel type transistor having holes as carriers. In that case, the first conductivity type is p-type, and the second conductivity type is n-type.

In addition, a stacked structure of a crystallized aluminum nitride layer provided with fixed polarization by orientation and an oxide layer of a silicon oxide or the like can also be applied to the gate insulating layer. In this case, since there is almost no difference in lattice constant between a SiC and an aluminum nitride, interface defects are suppressed, and the mobility of electrons is improved.

In addition, in the fourth to eighth embodiments, a case where the semiconductor device according to the embodiments is applied to a vehicle or an elevator is described as an example, but the semiconductor device according to the embodiments can be applied to, for example, a power conditioner of a solar power generation system.

While certain embodiments have been described, these embodiments have been presented by way of example only, and are not intended to limit the scope of the inventions. Indeed, semiconductor devices, inverter circuits, driving devices, vehicles, and elevators described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
   a semiconductor layer having a first plane and a second plane facing the first plane;
   a first semiconductor region of a first conductivity type existing in the semiconductor layer;
   a second semiconductor region of a second conductivity type existing in the semiconductor layer and being located between the first semiconductor region and the first plane;

a third semiconductor region of a second conductivity type existing in the semiconductor layer and being located between the first semiconductor region and the first plane;

a fourth semiconductor region of a first conductivity type existing in the semiconductor layer and being located between the second semiconductor region and the first plane;

a fifth semiconductor region of a first conductivity type existing in the semiconductor layer and being located between the third semiconductor region and the first plane;

a first trench existing in the semiconductor layer and being located between the fourth semiconductor region and the fifth semiconductor region and over from the second semiconductor region to the third semiconductor region;

a second trench existing in the semiconductor layer and being located between the fourth semiconductor region and the fifth semiconductor region and over from the second semiconductor region to the third semiconductor region;

a sixth semiconductor region of a first conductivity type existing in the semiconductor layer, being located between the first semiconductor region and the first plane, and being located between the second semiconductor region and the third semiconductor region and between the first trench and the second trench;

a seventh semiconductor region of a second conductivity type existing in the semiconductor layer, being located between the first trench and the first semiconductor region, and being in contact with the second semiconductor region and the third semiconductor region;

an eighth semiconductor region of a second conductivity type existing in the semiconductor layer, being located between the second trench and the first semiconductor region, and being in contact with the second semiconductor region and the third semiconductor region;

a first gate electrode located in the first trench;

a second gate electrode located in the second trench;

a first gate insulating layer located between the first gate electrode and the second semiconductor region and between the first gate electrode and the third semiconductor region;

a second gate insulating layer located between the second gate electrode and the second semiconductor region and between the second gate electrode and the third semiconductor region;

a first electrode located on a side of the semiconductor layer closer to the first plane; and a second electrode located on a side of the semiconductor layer closer to the second plane.

2. The semiconductor device according to claim 1, wherein a first conductivity type impurity concentration of the sixth semiconductor region is higher than a first conductivity type impurity concentration of the first semiconductor region.

3. The semiconductor device according to claim 1, wherein a second conductivity type impurity concentration of the seventh semiconductor region is higher than a second conductivity type impurity concentration of the second semiconductor region.

4. The semiconductor device according to claim 1, wherein a distance between the first trench and the second plane is larger than a distance between the second semiconductor region and the second plane.

5. The semiconductor device according to claim 1, wherein a distance between the first trench and the second plane is larger than a distance between the fourth semiconductor region and the second plane.

6. The semiconductor device according to claim 1, further comprising a ninth semiconductor region of a first conductivity type being provided between the first semiconductor region and the second semiconductor region and having a first conductivity type impurity concentration higher than that of the first semiconductor region.

7. The semiconductor device according to claim 1, further comprising a tenth semiconductor region of a first conductivity type being provided between the first semiconductor region and the sixth semiconductor region and having a first conductivity type impurity concentration higher than that of the first semiconductor region.

8. The semiconductor device according to claim 7, wherein a first conductivity type impurity concentration of the sixth semiconductor region is higher than a first conductivity type impurity concentration of the tenth semiconductor region.

9. The semiconductor device according to claim 8, further comprising an eleventh semiconductor region of a first conductivity type being provided between the tenth semiconductor region and the sixth semiconductor region and having a first conductivity type impurity concentration lower than that of the tenth semiconductor region.

10. The semiconductor device according to claim 9, wherein the eleventh semiconductor region is located between the seventh semiconductor region and the eighth semiconductor region.

11. The semiconductor device according to claim 1, wherein the semiconductor layer is a silicon carbide.

12. The semiconductor device according to claim 11, wherein the seventh semiconductor region and the eighth semiconductor region contain aluminum and boron.

13. An inverter circuit comprising the semiconductor device according to claim 1.

14. A driving device comprising the semiconductor device according to claim 1.

15. A vehicle comprising the semiconductor device according to claim 1.

16. An elevator comprising the semiconductor device according to claim 1.

* * * * *